United States Patent
Inumiya et al.

(10) Patent No.: US 9,362,487 B2
(45) Date of Patent: Jun. 7, 2016

(54) FERROELECTRIC MEMORY AND MANUFACTURING METHOD OF THE SAME

(71) Applicant: KABUSHIKI KAISHA TOSHIBA, Tokyo (JP)

(72) Inventors: Seiji Inumiya, Yokkaichi (JP); Yoshio Ozawa, Yokohama (JP); Koji Yamakawa, Tokyo (JP); Atsuko Sakata, Yokkaichi (JP); Masayuki Tanaka, Yokkaichi (JP); Junichi Wada, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 13 days.

(21) Appl. No.: 14/020,262

(22) Filed: Sep. 6, 2013

(65) Prior Publication Data

US 2014/0070290 A1    Mar. 13, 2014

(30) Foreign Application Priority Data

Sep. 10, 2012    (JP) .................................. 2012-198891

(51) Int. Cl.
*H01L 21/02*    (2006.01)
*H01L 43/10*    (2006.01)
*H01L 43/12*    (2006.01)
(Continued)

(52) U.S. Cl.
CPC ............ *H01L 43/10* (2013.01); *H01L 27/1159* (2013.01); *H01L 27/11597* (2013.01); *H01L 29/516* (2013.01); *H01L 29/6684* (2013.01); *H01L 43/12* (2013.01)

(58) Field of Classification Search
CPC ...... H01L 43/10; H01L 43/12; H01L 27/1159; H01L 27/11597; H01L 29/516; H01L 29/6684
USPC .......................................................... 257/295
See application file for complete search history.

(56) References Cited

U.S. PATENT DOCUMENTS 6,054,734 A * 4/2000 Aozasa ................. H01L 27/112
                                                              257/314
6,144,579 A   11/2000 Taira
(Continued)

FOREIGN PATENT DOCUMENTS

JP    2003-158262    5/2003
JP    2003-179051    6/2003
(Continued)

OTHER PUBLICATIONS

Minami Yoshihiro, "Semiconductor Memory Device", English-language Abstract of JP 2011165711, (Aug. 25, 2011).
(Continued)

*Primary Examiner* — Phat X Cao
*Assistant Examiner* — Mohammad M Hoque
(74) *Attorney, Agent, or Firm* — Finnegan, Henderson, Farabow, Garrett & Dunner, LLP

(57) ABSTRACT

According to one embodiment, a ferroelectric memory includes a semiconductor layer, an interfacial insulating film formed on the semiconductor layer, a ferroelectric film formed on the interfacial insulating film, and a gate electrode formed on the ferroelectric film, wherein the ferroelectric film is a film which includes a metal that is hafnium (Hf) or zirconium (Zr) and oxygen as the main components and to which an element selected from the group consisting of silicon (Si), magnesium (Mg), aluminum (Al).

3 Claims, 25 Drawing Sheets

(51) Int. Cl.
*H01L 29/51* (2006.01)
*H01L 29/66* (2006.01)
*H01L 27/115* (2006.01)

(56) References Cited

U.S. PATENT DOCUMENTS

| | | | |
|---|---|---|---|
| 7,151,684 B2 * | 12/2006 | Matsunaga | G11C 16/0483 257/E21.69 |
| 2004/0070020 A1 | 4/2004 | Fujiwara et al. | |
| 2004/0121566 A1 * | 6/2004 | Laibowitz | C23C 16/0272 438/482 |
| 2004/0171276 A1 | 9/2004 | Watanabe et al. | |
| 2006/0081901 A1 | 4/2006 | Arimoto et al. | |
| 2006/0157754 A1 | 7/2006 | Jeon et al. | |
| 2006/0273344 A1 * | 12/2006 | Lee | H01L 21/28079 257/137 |
| 2007/0096104 A1 * | 5/2007 | Tatsumi | H01L 21/28167 257/66 |
| 2009/0057737 A1 * | 3/2009 | Boescke | H01L 21/28291 257/295 |
| 2011/0018047 A1 | 1/2011 | Komiya | |
| 2011/0163411 A1 * | 7/2011 | Jang | H01L 21/8221 257/506 |
| 2011/0188288 A1 | 8/2011 | Minami | |

FOREIGN PATENT DOCUMENTS

| | | |
|---|---|---|
| JP | 2004-079606 | 3/2004 |
| JP | 2007-115733 | 5/2007 |
| JP | 2007-194652 | 8/2007 |
| JP | 2007-250974 | 9/2007 |
| JP | 2008-235339 | 10/2008 |
| JP | 2010-062222 | 3/2010 |
| JP | 2010-199200 | 9/2010 |
| JP | 2010199200 A * | 9/2010 |
| JP | 2012-023119 | 2/2012 |

OTHER PUBLICATIONS

Watanabe Heiji, at al., "Semiconductor Device Having High-Permittivity Insulation Film and Production Method Therefor", English-language Abstract of WO 03019643, (Mar. 6, 2003).

Taira Shigenobu, "Ferroelectric Storage Device, Flash Memory and Non-Volatile Random Access Memory", English-language Abstract of JP 11176958. (Jul. 2, 1999).

Komiya Ken, "Nonvolatile Semiconductor Memory Device and Method of Manufacturing the Same", Engish-language Abstract of JP 2011014638, (Jan. 20, 2011).

Jeon Sang-Hun, at al., "Semiconductor Device Comprising Insulating Film of High Dielectric Constant and Method of Manufacturing Same". English-language Abstract of JP 2006203200, (Aug. 3, 2006).

Arimoto Yoshihiro, at al., "Ferroelectric Memory, Method of Recording Multi-Value Data, and Method of Reading the Multi-Value Data", English-lanquage Abstract of JP 2006108648, (Apr. 20, 2006).

Fujiwara Ichiro, et al., "Involatile Semiconductor Storage and Method of Operating the Same", English-language Abstract of JP 2001237330, (Aug. 31, 2001).

T.S. Böscke, et al., "Ferroelectricity in Hafnium Oxide: CMOS compatible Ferroelectric Field Effect Transistors", IEDM11, (2011), pp. 24.5,1-24.5.4.

* cited by examiner

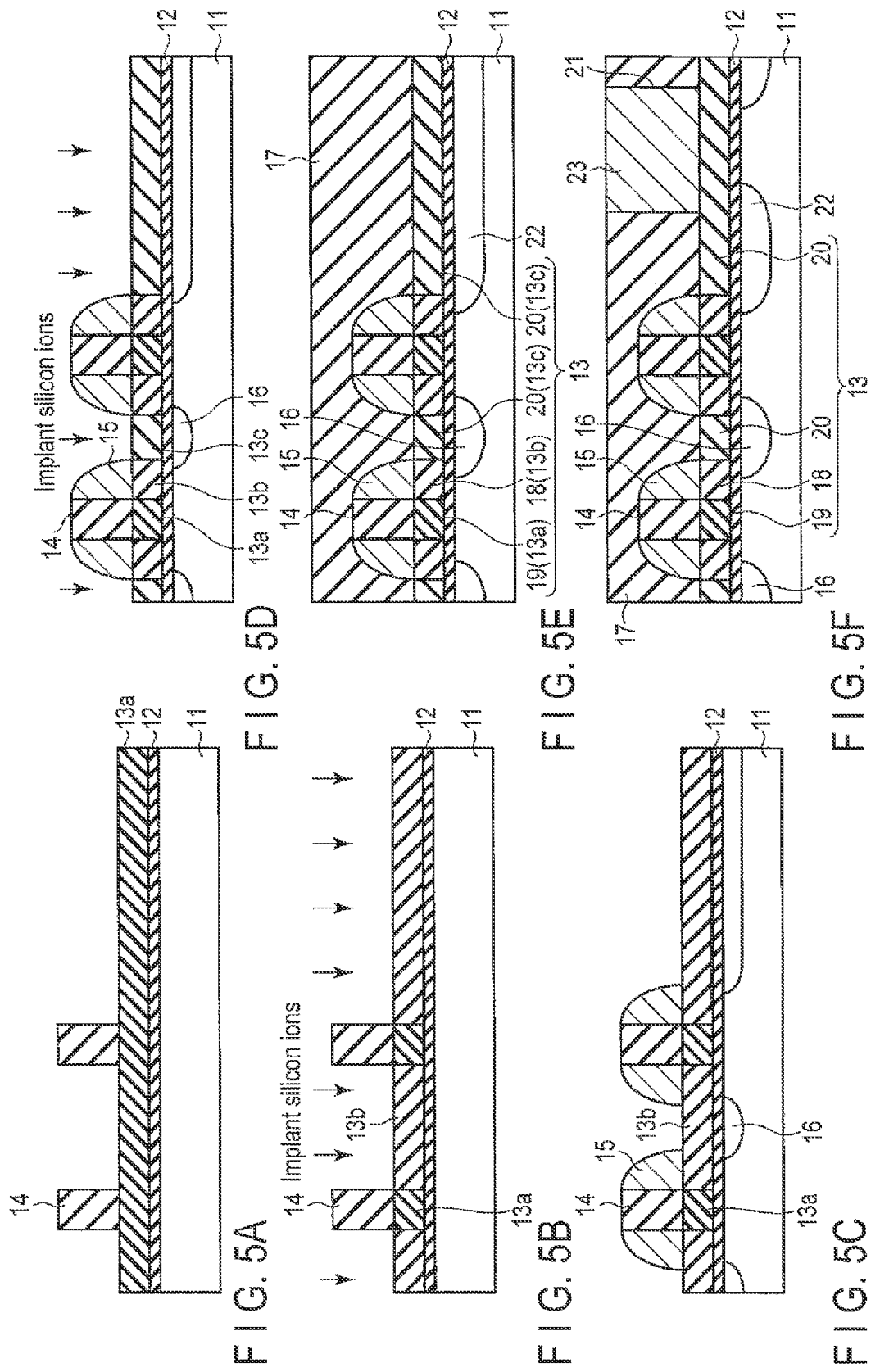

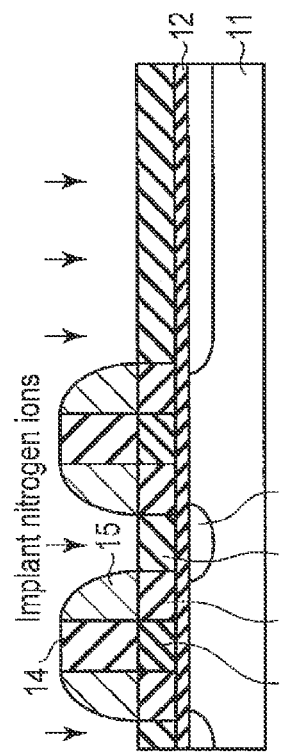
F I G. 6A
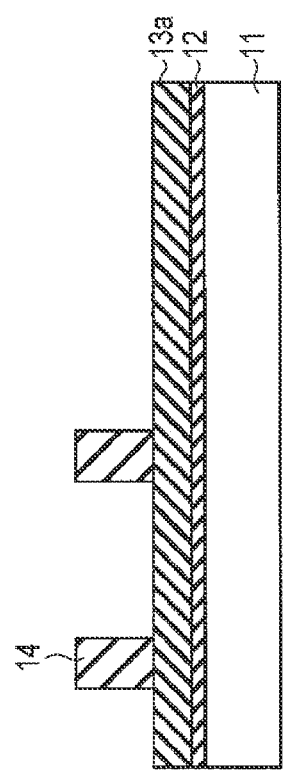
F I G. 6B
F I G. 6C
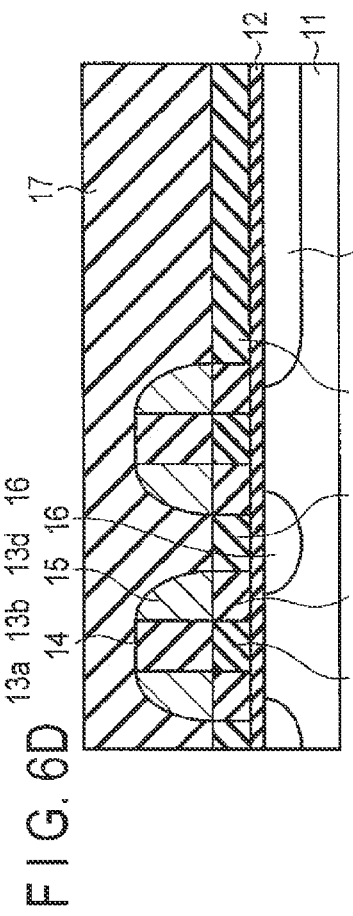
F I G. 6D
F I G. 6E
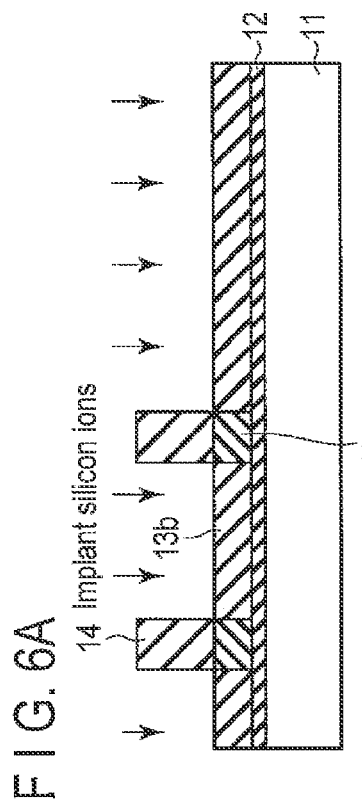
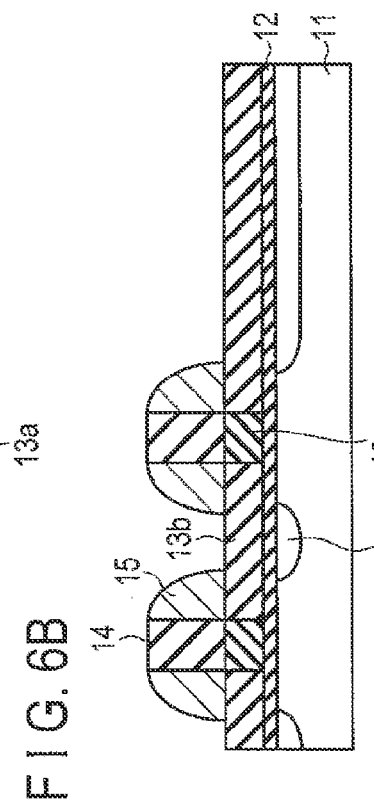
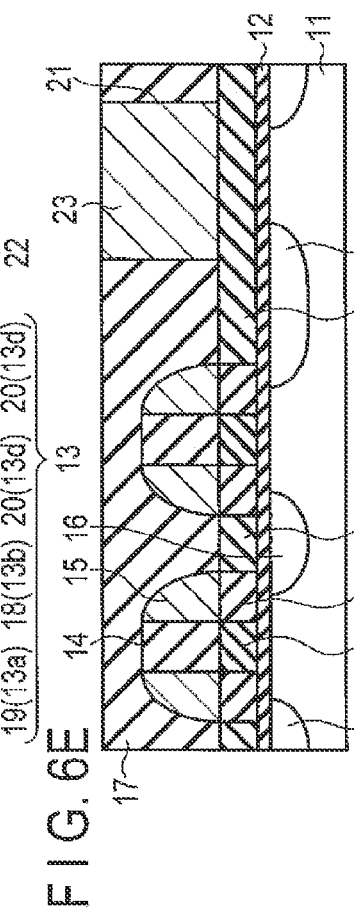
F I G. 6F

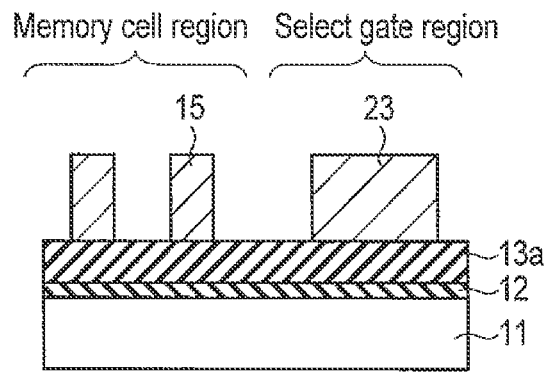
F I G. 7A
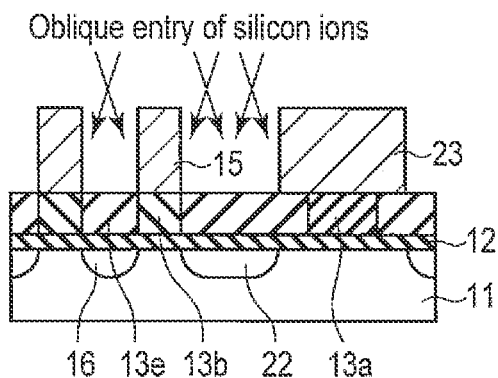
F I G. 7B
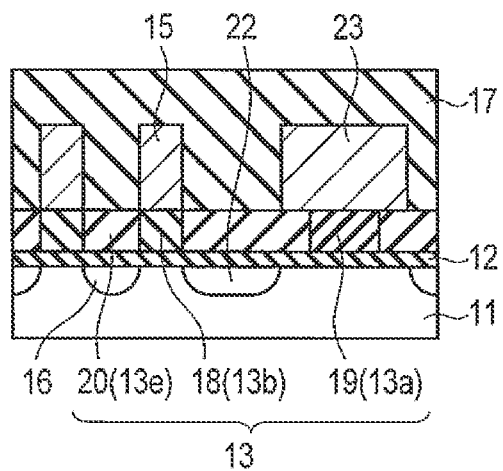
F I G. 7C

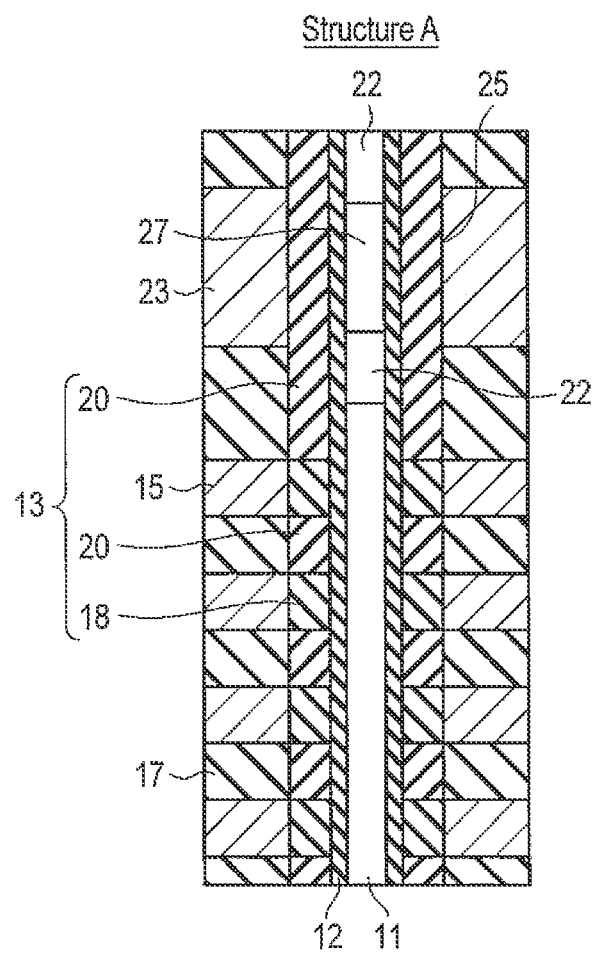
F I G. 9

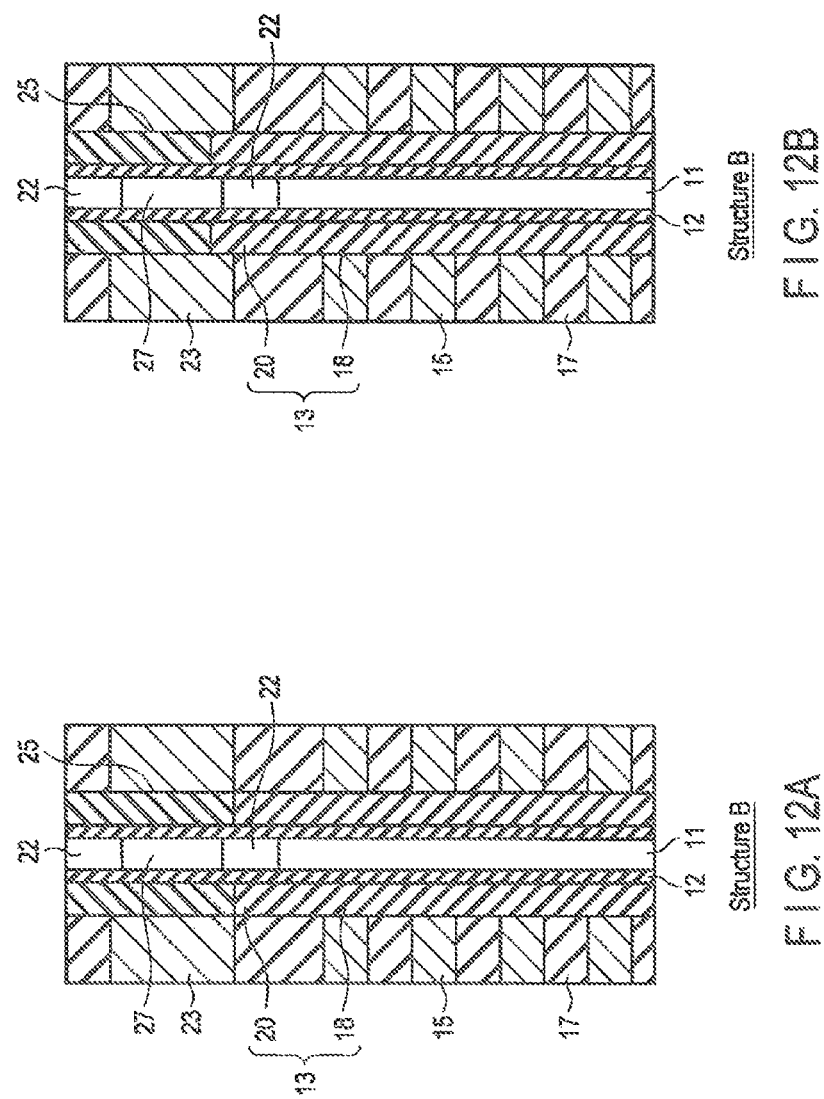

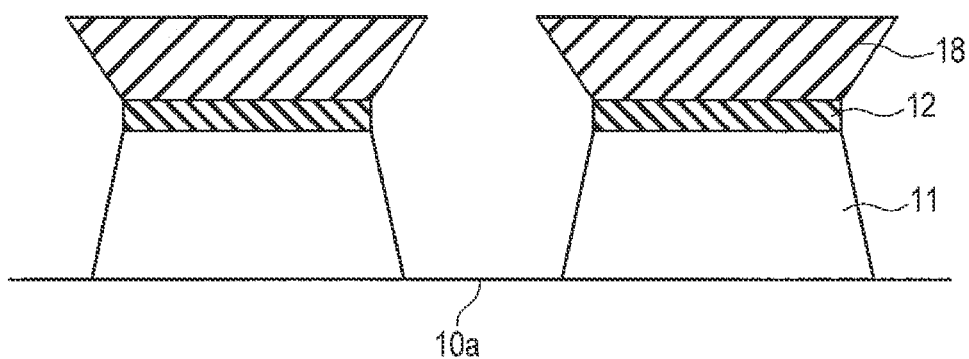
F I G. 17A
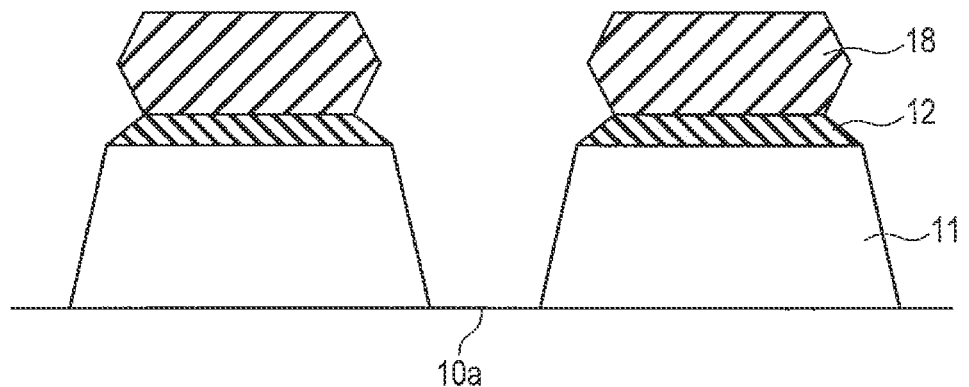
F I G. 17B
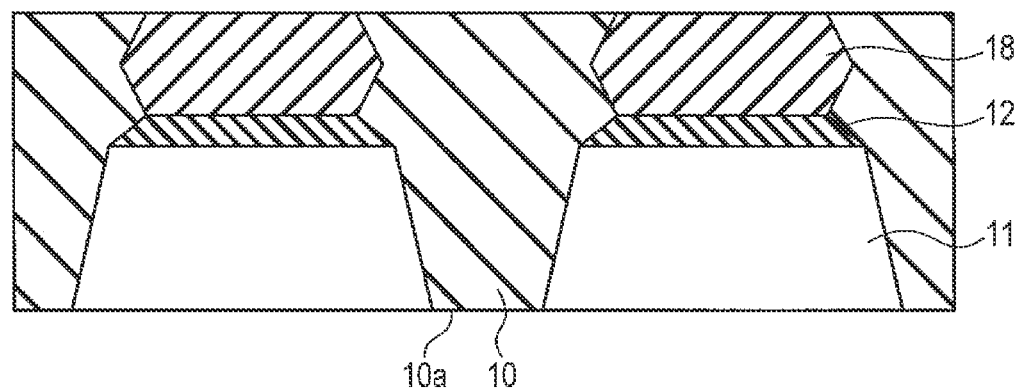
F I G. 17C

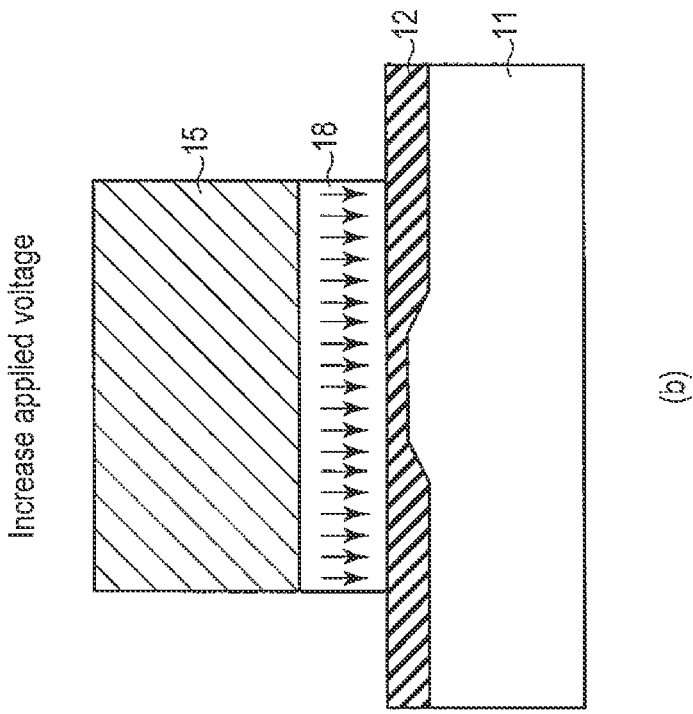
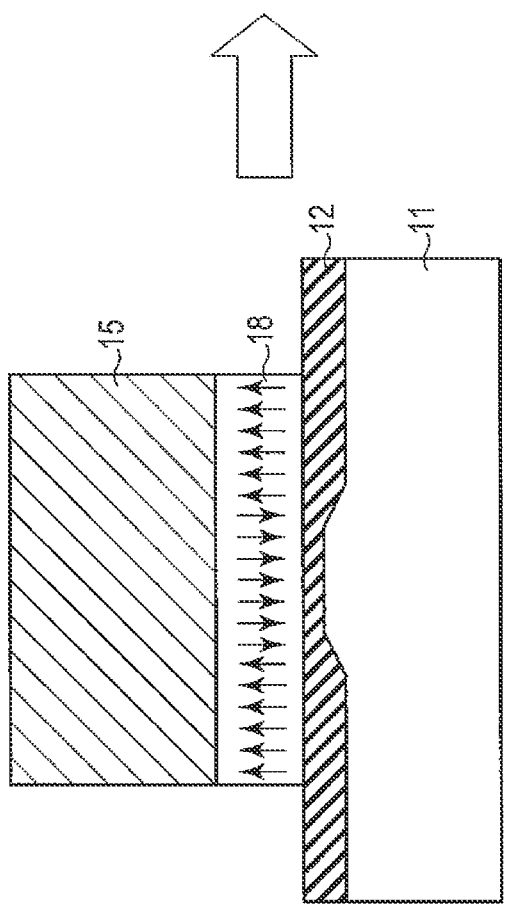
F I G. 20

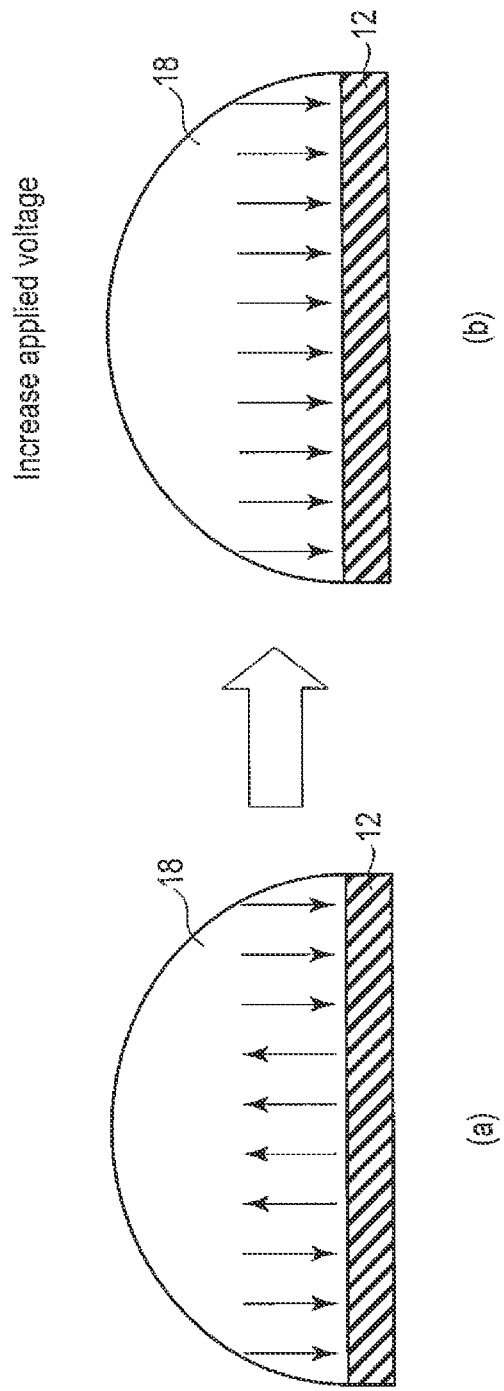
F I G. 23

FERROELECTRIC MEMORY AND MANUFACTURING METHOD OF THE SAME

CROSS-REFERENCE TO RELATED APPLICATIONS

This application is based upon and claims the benefit of priority from Japanese Patent Application No. 2012-198891, filed Sep. 10, 2012, the entire contents of which are incorporated herein by reference.

FIELD

Embodiments described herein relate generally to a ferroelectric memory and a manufacturing method of the same.

BACKGROUND

A ferroelectric memory has been drawing attention as a nonvolatile memory capable of high-speed operation. The ferroelectric memory is a memory that uses spontaneous polarization of a ferroelectric substance, and includes a capacitor type which is a combination of a transistor and a capacitor, and a transistor type which is used as a gate insulating film of a transistor.

There has been known an example that uses a ferroelectric phase of a hafnium silicate (HfSiOx) as the transistor-type ferroelectric memory. In this example, a gate insulating film is formed on a semiconductor substrate, an HfSiOx film which is a ferroelectric film is formed on the gate insulating film, and a control electrode is formed on the HfSiOx film. A voltage applied from the control electrode is then used to invert the polarization within the ferroelectric film and thereby write/erase information in memory cells. There has been a demand for improvements of memory characteristics in the transistor-type ferroelectric memories.

BRIEF DESCRIPTION OF THE DRAWINGS

FIGS. 5A, 5B, 5C, 5D, 5E, and 5F are one example of a sectional view showing a manufacturing method (1) of the flat NAND type ferroelectric memory according to the first embodiment;

FIGS. 6A, 6B, 6C, 6D, 6E, and 6F are one example of a sectional view showing a manufacturing method (2) of the flat NAND type ferroelectric memory according to the first embodiment;

FIGS. 7A, 7B, and 7C are one example of a sectional view showing a manufacturing method (3) of the flat NAND type ferroelectric memory according to the first embodiment;

FIG. 9 is one example of a sectional view showing a structure A of a BiCS type ferroelectric memory according to a second embodiment;

FIGS. 12A and 12B are one example of a sectional view showing a modification of the structure B of the BiCS type ferroelectric memory according to the second embodiment;

FIGS. 17A, 17B, and 17C are one example of a sectional view showing a manufacturing method of the ferroelectric memory according to the third embodiment;

FIG. 20 is one example of a diagram illustrating the polarization of the ferroelectric memory according to the fourth embodiment;

FIG. 23 is one example of a diagram illustrating the polarization of the ferroelectric memory according to the fifth embodiment;

DETAILED DESCRIPTION

In general, according to one embodiment, a ferroelectric memory includes:

a semiconductor layer;

an interfacial insulating film formed on the semiconductor layer;

a ferroelectric film formed on the interfacial insulating film; and a gate electrode formed on the ferroelectric film, wherein the ferroelectric film is a film which includes a metal that is hafnium (Hf) or zirconium (Zr) and oxygen as the main components and to which an element selected from the group consisting of silicon (Si), magnesium (Mg), aluminum (Al), and yttrium (Y) is added, the ferroelectric film is divided into cells in a channel width direction, and the width of the ferroelectric film on the gate electrode side is greater than the width of the ferroelectric film on the semiconductor layer side in the channel width direction.

Hereinafter, embodiments will be described with reference to the drawings. In the description, like reference signs are given to like parts throughout the drawings.

[1] First Embodiment

A ferroelectric memory according to the first embodiment has a flat NAND memory cell string structure.

[1-1] Structure A

Figure 1:
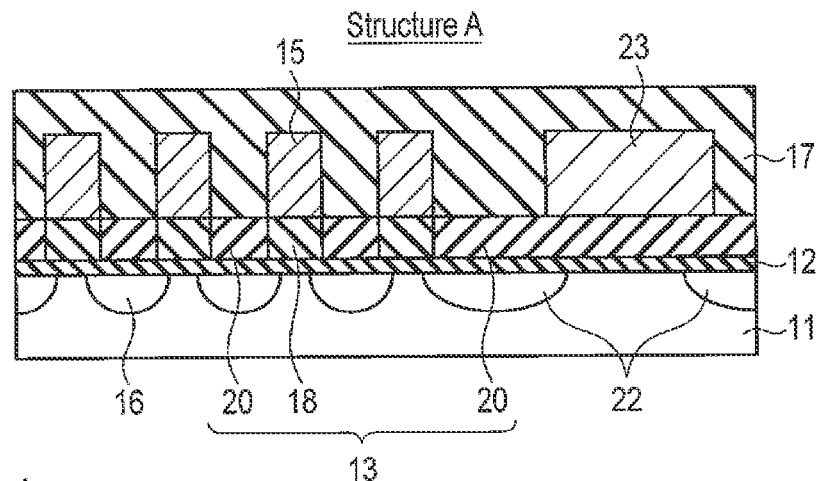
FIG. 1 is one example of a sectional view showing a structure A of a flat NAND type ferroelectric memory according to a first embodiment.

A structure A of the flat NAND type ferroelectric memory according to the first embodiment is described with reference to FIG. 1. FIG. 1 is a sectional view in a channel length direction.

As shown in FIG. 1, an interfacial insulating film 12 and a gate insulating film 13 are stacked on, for example, a p-type semiconductor substrate 11. On the gate insulating film 13, a plurality of cell gate electrodes 15 are provided about 10 nm apart from one another. An n-type diffusion layer 16 is formed in a surface layer of the semiconductor substrate 11 between the adjacent cell gate electrodes 15, such that a ferroelectric memory cell transistor is formed. At at least one end of the memory cell string comprising the cell gate electrodes 15, a select gate electrode 23 is provided at a distance of about 30 nm. High-concentration n-type diffusion layers 22 are formed in the surface layer of the semiconductor substrate 11 under both ends of the select gate electrode 23, such that a select gate transistor is formed. The cell gate electrodes 15 and the select gate electrode 23 are covered with an interlayer insulating film 17.

Here, the semiconductor substrate 11 is formed by, for example, a p-type silicon substrate. The interfacial insulating film 12 is formed by, for example, a silicon oxide film having a thickness of 1 nm. The gate insulating film 13 is formed by, for example, an insulating film having a thickness of 5 nm and including hafnium oxide (HfOx) as the main component. The cell gate electrodes 15 and the select gate electrode 23 are formed by, for example, titanium nitride. The interlayer insulating film 17 is formed by, for example, a silicon oxide film.

The gate insulating film 13 according to the first embodiment is not divided into cells in a channel width direction, and is continuously formed in a cell gate region, an inter-adjacent-cell-gate region, and a select gate region. However, a gate insulating film 18 (13) in the cell gate region has a ferroelectric crystal structure, and a gate insulating film 20 (13) in the inter-adjacent-cell-gate region and the select gate region has a nonferroelectric crystal structure. Details are described below.

[1-1-1] Gate Insulating Film in Cell Gate Region

The gate insulating film 18 in the cell gate region is an orthorhombic ferroelectric film in which the number of Si atoms/(the number of Hf atoms+the number of Si atoms) is 0.02 or more and 0.05 or less. The number of Si atoms and the number of Hf atoms can be measured by an XPS or an atom probe. For example, tertiary orthorhombic crystal (orthorhombic III) shows ferroelectricity.

[1-1-2] Gate Insulating Film in Inter-Adjacent-Cell-Gate Region

The gate insulating film 20 in the inter-adjacent-cell-gate region is formed, for example, as shown in (1) to (4) below.

(1) The gate insulating film 20 in the inter-adjacent-cell-gate region is configured so that the number of Si atoms/(the number of Hf atoms+the number of Si atoms) is less than 0.02 or more than 0.05, and does not show ferroelectricity.

In this case, it is possible to avoid any wrong memory operation resulting from the polarization of the gate insulating film 20 in the inter-adjacent-cell-gate region caused by a leakage electric field.

(2) The gate insulating film 20 in the inter-adjacent-cell-gate region is made of a hafnium silicate (HfSiO) film in which the number of Si atoms/(the number of Hf atoms+the number of Si atoms) is 0.5 or more.

In this case, the dielectric constant of the gate insulating film 20 in the inter-adjacent-cell-gate region is reduced by 10% or more as compared with the dielectric constant of the gate insulating film 18 in the cell gate region. Thus, it is also possible to avoid any wrong memory operation resulting from a threshold variation (what is known as an inter-cell interference effect) of a cell transistor caused by a leakage electric field from the adjacent cell gate electrode 15. This is advantageous to the shrinking of a memory cell string.

(3) The gate insulating film 20 in the inter-adjacent-cell-gate region is made of a hafnium silicate film in which the number of Si atoms/(the number of Hf atoms+the number of Si atoms) is 0.02 or more and 0.05 or less and to which 0.1 atomic percent or more of at least one of a nitrogen element (N) and a carbon element (C) is added. The nitrogen content and carbon content in the present embodiment are respectively defined by the amount of N relative to all the elements, that is, N/all the elements (e.g. N/(Si+Hf+O+N+C), and C/(Si+Hf+O+N+C)), and are represented by percentage.

In this case, the nitrogen element and the carbon element act as fixed charge impurities that inhibit polarization. Thus, the polarization of the gate insulating film 20 in the inter-adjacent-cell-gate region is suppressed, and any wrong memory operation can be avoided.

(4) The gate insulating film 20 in the inter-adjacent-cell-gate region is made of a hafnium silicate film in which the number of Si atoms/(the number of Hf atoms+the number of Si atoms) is 0.02 or more and 0.05 or less and which has a content of oxygen (O) lower than that of the gate insulating film 18 in the cell gate region and which satisfies the relation O/(Hf+Si)<2.

In this case, the gate insulating film 20 is in what is known as an oxygen-deficient state in which the concentration of the oxygen element is lower than a stoichiometric coefficient. In this oxygen-deficient state, the polarization is inhibited. Thus, the polarization of the gate insulating film 20 in the inter-adjacent-cell-gate region is suppressed, and any wrong memory operation can be avoided.

[1-1-3] Gate Insulating Film in Select Gate Region

The gate insulating film 20 in the select gate region is configured so that the number of Si atoms/(the number of Hf atoms+the number of Si atoms) is less than 0.02 or more than 0.05, and does not show ferroelectricity.

The gate insulating film 20 in the select gate region may have a configuration shown in (3) or (4) in the section [1-1-2].

[1-1-4] Specific Examples

The ferroelectric memory having the structure A according to the present embodiment has a memory cell string in which the cell gate electrodes 15 are provided apart from one another on the semiconductor substrate 11 via the gate insulating film 13. Here, the gate insulating films 18 and 20 (13) in the select gate region and the inter-adjacent-cell-gate region have the following configurations.

In a specific example 1 of the structure A according to the present embodiment, the gate insulating films 18 and 20 contain hafnium oxide as the main component. The gate insulating film 18 in the cell gate region is configured so that the number of Si atoms/(the number of Hf atoms+the number of Si atoms) is 0.02 or more and 0.05 or less. The gate insulating film 20 in the inter-adjacent-cell-gate region is configured so that the number of Si atoms/(the number of Hf atoms+the number of Si atoms) is less than 0.02 or more than 0.05. In this case, it is possible to avoid any wrong memory operation resulting from the polarization of the gate insulating film 20 in the inter-adjacent-cell-gate region caused by a leakage electric field.

In a specific example 2 of the structure A according to the present embodiment, the gate insulating films 18 and 20 are made of hafnium silicate. The gate insulating film 18 in the cell gate region is configured so that the number of Si atoms/(the number of Hf atoms+the number of Si atoms) is 0.02 or more and 0.05 or less. The gate insulating film 20 in the select gate region is configured so that the number of Si atoms/(the number of Hf atoms+the number of Si atoms) is 0.5 or more. In this case, it is possible to avoid any wrong memory operation resulting from the polarization of the gate insulating film 20 in the inter-adjacent-cell-gate region caused by a leakage electric field, and also avoid any wrong memory operation resulting from a threshold variation of the cell transistor caused by a leakage electric field from the adjacent cell gate electrode 15.

In a specific example 3 of the structure A according to the present embodiment, the gate insulating films 18 and 20 contain hafnium silicate as the main component. The gate insulating film 18 in the cell gate region is configured so that the number of Si atoms/(the number of Hf atoms+the number of Si atoms) is 0.02 or more and 0.05 or less. The gate insulating film 20 in the inter-adjacent-cell-gate region is configured so that the number of Si atoms/(the number of Hf atoms+the number of Si atoms) is 0.02 or more and 0.05 or less and so that 0.1 atomic percent or more of at least one of a nitrogen element and a carbon element is added. In this case, it is possible to avoid any wrong memory operation resulting from the polarization of the gate insulating film 20 in the inter-adjacent-cell-gate region caused by a leakage electric field.

In a specific example 4 of the structure A according to the present embodiment, the gate insulating films 18 and 20 are made of hafnium silicate. The gate insulating film 18 in the cell gate region and in the gate insulating film 20 in the inter-adjacent-cell-gate region are configured so that the number of Si atoms/(the number of Hf atoms+the number of Si atoms) is 0.02 or more and 0.05 or less. Moreover, the content of oxygen in the gate insulating film 20 in the inter-adjacent-cell-gate region is lower than that of the gate insulating film 18 in the cell gate region, and the relation O/(Hf+Si)<2 is satisfied. In this case, it is possible to avoid any wrong memory operation resulting from the polarization of the gate insulating film 20 in the inter-adjacent-cell-gate region caused by a leakage electric field.

[1-1-5] Modifications

As shown in FIG. 1, in the structure A according to the first embodiment, the boundary between the gate insulating film 18 and the gate insulating film 20 corresponds to the side surface of the cell gate electrode 15. However, the structure A is not limited thereto.

Figure 2A:
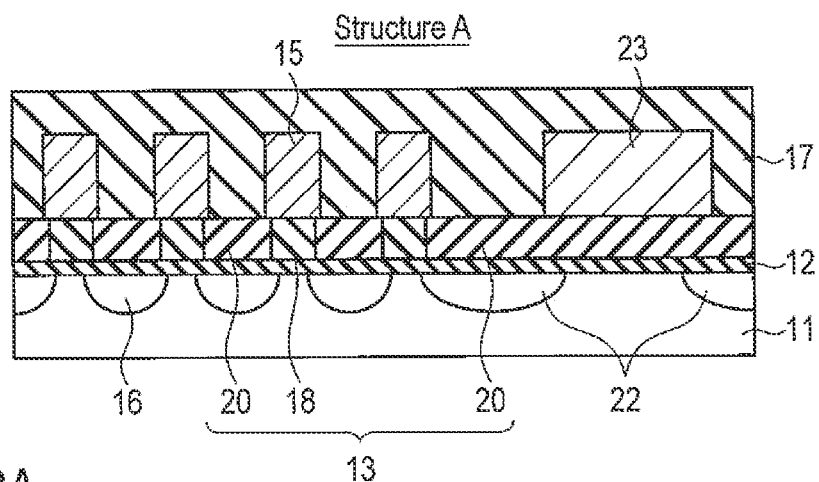
FIGS. 2A and 2B are one example of a sectional view showing a modification of the structure A of the flat NAND type ferroelectric memory according to the first embodiment.
Figure 2B:
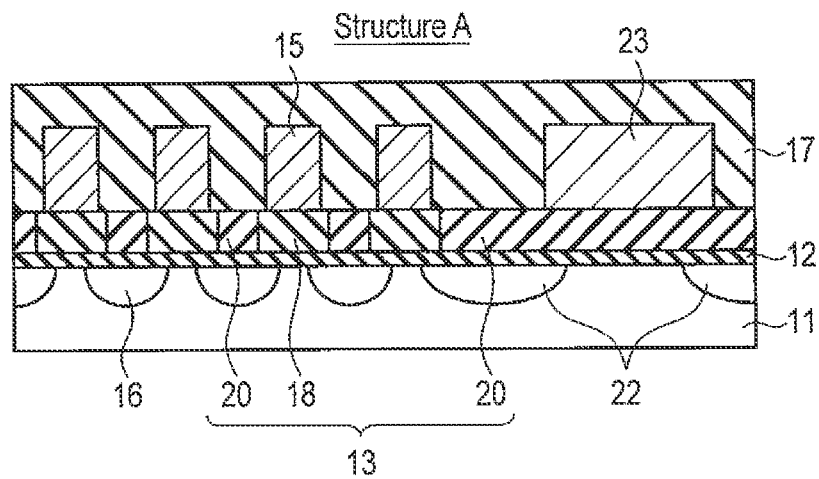

For example, as shown in FIG. 2A, the boundary between the gate insulating film 18 and the gate insulating film 20 may be located inside the side surface of the cell gate electrode 15. Alternatively, as shown in FIG. 2B, the boundary between the gate insulating film 18 and the gate insulating film 20 may be located outside the side surface of the cell gate electrode 15.

[1-1] Structure B

A structure B of the flat ferroelectric memory according to the first embodiment is described with reference to FIG. 3. Similarities between the structure A and the structure B are not described.

Figure 3:
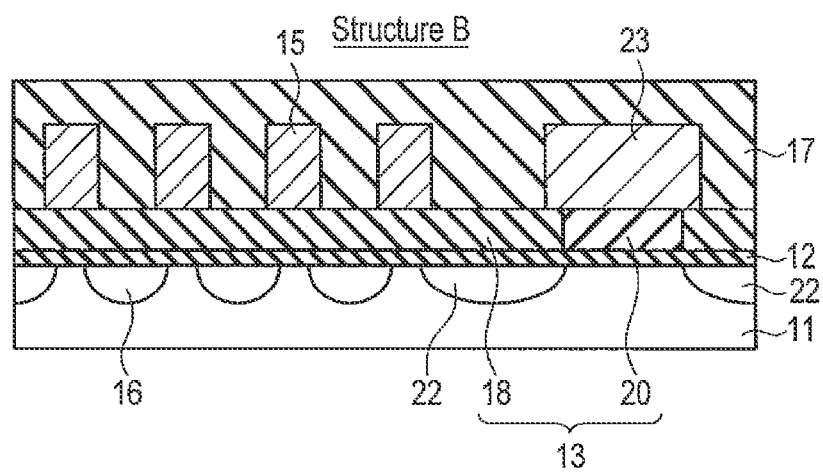
FIG. 3 is one example of a sectional view showing a structure B of the flat NAND type ferroelectric memory according to the first embodiment.

As shown in FIG. 3, the structure B is different from the structure A in that both of the gate insulating film 18 in the cell gate region and the gate insulating film 18 in the inter-adjacent-cell-gate region have ferroelectric crystal structures and in that the gate insulating film 20 in the select gate region has a nonferroelectric crystal structure. Details are described below. Hereinafter, the cell gate region and the inter-adjacent-cell-gate region are collectively referred to as a memory cell region.

[1-2-1] Gate Insulating Film in Memory Cell Region

The gate insulating film 18 in the memory cell region is configured so that the number of Si atoms/(the number of Hf atoms+the number of Si atoms) is 0.02 or more and 0.05 or less, and is orthorhombic and ferroelectric.

[1-2-2] Gate Insulating Film in Select Gate Region

The gate insulating film 20 in the select gate region corresponds to, for example, as shown in (1) to (4) below.

(1) The gate insulating film 20 in the select gate region is configured so that the number of Si atoms/(the number of Hf atoms+the number of Si atoms) is less than 0.02 or more than 0.05, and does not show ferroelectricity.

(2) The gate insulating film 20 in the select gate region is configured so that the number of Si atoms/(the number of Hf atoms+the number of Si atoms) is 0.06 or more and 0.3 or less.

In this case, a dielectric constant which is 20 percent or more higher than that when no silicon element is contained is obtained. It is thus possible to avoid a short channel effect of the select gate transistor and also reduce the width of the select gate electrode 23. That is, it is possible to avoid any wrong memory operation resulting from polarization immediately under the select gate electrode 23 and at the same time miniaturize the memory cell string.

(3) The gate insulating film 20 in the select gate region is made of a hafnium silicate film in which the number of Si atoms/(the number of Hf atoms+the number of Si atoms) is 0.02 or more and 0.05 or less and to which 0.1 atomic percent or more of at least one of a nitrogen element and a carbon element is added.

In this case, the nitrogen element and the carbon element act as fixed charge impurities that inhibit polarization. Thus, the polarization of the gate insulating film 20 in the select gate region is suppressed, and any wrong memory operation can be avoided. Moreover, a dielectric constant which is 20 percent or more higher than that when no silicon element is contained is obtained, so that the width of the select gate electrode 23 can be reduced and the memory cell string can be miniaturized.

(4) The gate insulating film 20 in the select gate region is made of a hafnium silicate film in which the number of Si atoms/(the number of Hf atoms+the number of Si atoms) is 0.02 or more and 0.05 or less and which has a content of oxygen lower than that of the gate insulating film 18 in the memory cell region and which satisfies the relation O/(Hf+Si)<2.

In this case, the gate insulating film 20 is in what is known as an oxygen-deficient state in which the concentration of the oxygen element is lower than a stoichiometric coefficient. In this oxygen-deficient state, the polarization is inhibited. Thus, the polarization of the gate insulating film 20 in the select gate region is suppressed, and any wrong memory operation can be avoided. Moreover, a dielectric constant which is 20 percent or more higher than that when no silicon element is contained is obtained, so that the width of the select gate electrode 23 can be reduced and the memory cell string can be shrunk.

[1-2-3] Specific Examples

The ferroelectric memory having the structure B according to the present embodiment has a memory cell string in which the cell gate electrodes 15 are provided apart from one another on the semiconductor substrate 11 via the gate insulating film 13. At least one end of the memory cell string, the select gate electrode 23 is formed. Here, the gate insulating films 18 and 20 (13) in the memory cell and the select gate region have the following configurations.

In a specific example 1 of the structure B according to the present embodiment, the gate insulating films 18 and 20 contain hafnium oxide as the main component. The gate insulating film 18 in the memory cell region is configured so that the number of Si atoms/(the number of Hf atoms+the number of Si atoms) is 0.02 or more and 0.05 or less. The gate insulating film 20 in the select gate region is configured so that the number of Si atoms/(the number of Hf atoms+the number of Si atoms) is less than 0.02 or more than 0.05. In this case, it is possible to avoid any wrong memory operation resulting from the polarization of the select gate region.

In a specific example 2 of the structure B according to the present embodiment, the gate insulating films 18 and 20 are made of hafnium silicate. The gate insulating film 18 in the cell gate region is configured so that the number of Si atoms/(the number of Hf atoms+the number of Si atoms) is 0.02 or more and 0.05 or less. The gate insulating film 20 in the select gate region is configured so that the number of Si atoms/(the number of Hf atoms+the number of Si atoms) is 0.06 or more and 0.3 or less. In this case, it is possible to avoid any wrong memory operation resulting from the polarization of the select gate region and at the same time miniaturize the select gate electrode 23.

In a specific example 3 of the structure B according to the present embodiment, the gate insulating films 18 and 20 contain hafnium silicate as the main component. The gate insulating film 18 in the cell gate region is configured so that the number of Si atoms/(the number of Hf atoms+the number of Si atoms) is 0.02 or more and 0.05 or less. The gate insulating film 20 in the select gate region is configured so that the number of Si atoms/(the number of Hf atoms+the number of Si atoms) is 0.02 or more and 0.05 or less and so that 0.1 atomic percent or more of at least one of a nitrogen element and a carbon element is added. In this case, it is possible to avoid any wrong memory operation resulting from the polarization of the select gate region and at the same time miniaturize the select gate electrode 23.

In a specific example 4 of the structure B according to the present embodiment, the gate insulating films 18 and 20 are made of hafnium silicate. The gate insulating film 18 in the cell gate region and the gate insulating film 20 in the select gate region are configured so that the number of Si atoms/(the number of Hf atoms+the number of Si atoms) is 0.02 or more and 0.05 or less. Moreover, the content of oxygen in the gate insulating film 20 in the select gate region is lower than that of the gate insulating film 18 in the cell gate region, and the relation O/(Hf+Si)<2 is satisfied. In this case, it is possible to avoid any wrong memory operation resulting from the polarization of the select gate region and at the same time miniaturize the select gate electrode 23.

[1-2-4] Modifications

As shown in FIG. 3, in the structure B according to the first embodiment, the boundary between the gate insulating film 18 and the gate insulating film 20 is located inside the side surface of the select gate electrode 23. However, the structure B is not limited thereto.

Figure 4A:
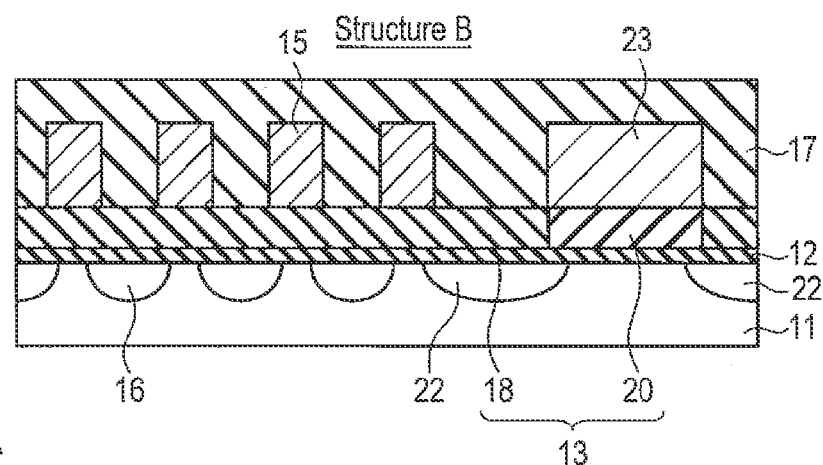
FIGS. 4A and 4B are one example of a sectional view showing a modification of the structure B of the flat NAND type ferroelectric memory according to the first embodiment.
Figure 4B:
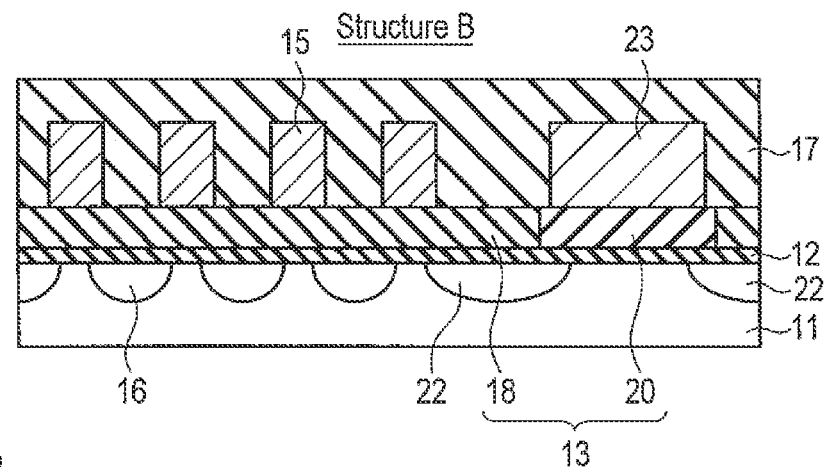

For example, as shown in FIG. 4A, the boundary between the gate insulating film 18 and the gate insulating film 20 may correspond to the side surface of the select gate electrode 23. Alternatively, as shown in FIG. 4B, the boundary between the gate insulating film 18 and the gate insulating film 20 may be located outside the side surface of the select gate electrode 23.

[1-3] Manufacturing Method (1)

A manufacturing method (1) of the flat ferroelectric memory according to the first embodiment is described with reference to FIGS. 5A, 5B, 5C, 5D, 5E, and 5F. The manufacturing method (1) is an example applied to a manufacturing method whereby a micro select gate electrode 15 having a width of about 10 nm can be formed.

First, as shown in FIG. 5A, an interfacial insulating film 12 made of a silicon oxide film having a thickness of about 1 nm is formed on a semiconductor substrate 11 made of a p-type silicon substrate, and an amorphous hafnium oxide film 13a (gate insulating film 13) having a thickness of about 5 nm is formed on the interfacial insulating film 12. Silicon oxide is then deposited on the amorphous hafnium oxide film 13a. A core material 14 made of a silicon oxide film and having a width of about 10 nm is then formed by a known lithographic technique and dry etching technique. The core material 14 may be a silicon nitride film.

As shown in FIG. 5B, the core material 14 is then used as a mask to add a silicon element to an exposed region of the amorphous hafnium oxide film 13a by an ion implantation method. Here, the dose amount should be adjusted so that the number of Si atoms to be added/(the number of Hf atoms+the number of Si atoms) will be, for example, about 0.03. As a result, an amorphous hafnium oxide film 13b to which silicon is added is formed in the exposed region of the amorphous hafnium oxide film 13a. The number of Si atoms to be added/(the number of Hf atoms+the number of Si atoms) is not limited to 0.03, and has only to be 0.02 or more and 0.05 or less.

As shown in FIG. 5C, a titanium nitride film is then deposited on the core material 14 and on the amorphous hafnium oxide film 13b to which silicon is added, and a cell gate electrode 15 made of a titanium nitride film and having a width of about 10 nm is then formed on the sidewall of the core material 14 by a known dry etching technique. Further, the core material 14 and the cell gate electrode 15 are used as masks to introduce a phosphorus element by the ion implantation method, so that a diffusion layer 16 is formed in a surface layer of the semiconductor substrate 11.

As shown in FIG. 5D, the core material 14 and the cell gate electrode 15 are used as masks to further add, by the ion implantation method, a silicon element to an exposed region of the amorphous hafnium oxide film 13b to which silicon has been added. Here, the dose amount should be adjusted so that the total of the number of Si atoms to be added/(the number of Hf atoms+the number of Si atoms) will be, for example, about 0.1. As a result, an amorphous hafnium oxide film 13c to which silicon is further added is formed in the exposed region of the amorphous hafnium oxide film 13b to which silicon is further added.

As shown in FIG. 5E, a phosphorus element is then selectively introduced into the select gate region by the ion implantation method to form a diffusion layer 22 in the surface layer of the semiconductor substrate 11. An interlayer insulating film 17 made of a silicon oxide film is then formed on the core material 14, the cell gate electrode 15, and the hafnium oxide film 13c. Lamp heating at about 1000° C. is then conducted to activate the diffusion layers 16 and 22 and at the same time crystallize the hafnium oxide films 13a, 13b, and 13c. Here, the hafnium oxide films 13a, 13b, and 13c are covered with various materials and are thus subjected to stress. Therefore, the hafnium oxide film 13b under the cell gate electrode 15 becomes an orthorhombic silicon-containing hafnium oxide film and serves as a ferroelectric insulating film 18. The hafnium oxide film 13a under the core material 14 becomes a cubic or monoclinic hafnium oxide film and serves as an insulating film 19 having a dielectric constant of about 20. The hafnium oxide film 13c in other regions becomes a cubic or monoclinic silicon-containing hafnium oxide film and serves as a high dielectric-constant insulating film 20 having a dielectric constant of about 30.

As shown in FIG. 5F, the interlayer insulating film 17 in the select gate region is then selectively removed, and a trench 21 is formed. The surface layer of the semiconductor substrate 11 is then counter-doped with boron by the ion implantation method, and converted to a p-type. Further, the trench 21 is filled with a titanium nitride film serving as a select gate electrode 23. A surface layer of the titanium nitride film is then planarized by a chemical mechanical polishing method, and the select gate electrode 23 is formed in the trench 21. A flat NAND memory cell string then is completed by a known wiring formation method.

A ferroelectric memory formed by the manufacturing method (1) has the following configuration.

As shown in FIG. 5F, the gate insulating film 13 (18, 19, 20) is not divided and continuously formed in the cell gate region, the inter-adjacent-cell-gate region, and the select gate region.

Here, the gate insulating film 18 in the cell gate region is formed by a hafnium oxide film in which the number of Si atoms/(the number of Hf atoms+the number of Si atoms) is 0.03, and is orthorhombic and ferroelectric. The gate insulating film 19 at one end (under the core material 14) of the cell gate electrode 15 in the inter-adjacent-cell-gate region is formed by a hafnium oxide film, is a cubic or monoclinic and nonferroelectric insulating film having a dielectric constant of about 20. The gate insulating film 20 at the other end (under the interlayer insulating film 17) of the cell gate electrode 15 in the inter-adjacent-cell-gate region and the gate insulating film 20 in the select gate region are formed by hafnium oxide films in which the number of Si atoms/(the number of Hf atoms+the number of Si atoms) is 0.1, and are nonferroelectric high dielectric-constant insulating films having a dielectric constant of about 30.

In other words, the gate insulating film 18 in the cell gate region has a ferroelectric crystal structure, and the gate insulating films 19 and 20 in the inter-adjacent-cell-gate region and the select gate region have nonferroelectric crystal structures. The gate insulating film 19 is different in the content of the silicon element from the gate insulating film 20, and is lower in silicon concentration than the gate insulating film 20.

In the process of the cell gate electrode 15, one upper end (upper end on the side opposite to the core material 14) of the cell gate electrode 15 is rounded. The upper surface of the select gate electrode 23 is higher than the upper surface of the cell gate electrode 15.

According to the manufacturing method (1) described above, the cell gate electrode 15 having a small width can be formed on the sidewall of the core material 14. Therefore, the memory cell can be highly integrated. As there is no polarization of the inter-adjacent-cell-gate region caused by a leakage electric field from the cell gate electrode 15 during writing/erasing, any wrong memory operation can be avoided.

Moreover, as no polarization is caused immediately under the select gate electrode 23 by an electric field during the operation of the select gate transistor, any wrong memory operation can be avoided. Further, the gate insulating film 20 in the select gate region has a high dielectric property, so that the width of the select gate electrode 23 can be reduced.

[1-4] Manufacturing Method (2)

A manufacturing method (2) of the flat ferroelectric memory according to the first embodiment is described with reference to FIGS. 6A, 6B, 6C, 6D, 6E, and 6F. The manufacturing method (2) is an example applied to a manufacturing method whereby a micro select gate electrode 15 having a width of about 10 nm can be formed.

First, as shown in FIG. 6A, an interfacial insulating film 12 made of a silicon oxide film having a thickness of about 1 nm is formed on a semiconductor substrate 11 made of a p-type silicon substrate, and an amorphous hafnium oxide film 13a (gate insulating film 13) having a thickness of about 5 nm is formed on the interfacial insulating film 12. Silicon oxide is then deposited on the amorphous hafnium oxide film 13a. A core material 14 made of a silicon oxide film and having a width of about 10 nm is then formed by a known lithographic technique and dry etching technique. The core material 14 may be a silicon nitride film.

As shown in FIG. 6B, the core material 14 is then used as a mask to add a silicon element to an exposed region of the amorphous hafnium oxide film 13a by an ion implantation method. Here, the dose amount should be adjusted so that the number of Si atoms to be added/(the number of Hf atoms+the number of Si atoms) will be, for example, about 0.03. As a result, an amorphous hafnium oxide film 13b to which silicon is added is formed in the exposed region of the amorphous hafnium oxide film 13a. The number of Si atoms to be added/(the number of Hf atoms+the number of Si atoms) is not limited to 0.03, and has only to be 0.02 or more and 0.05 or less.

As shown in FIG. 6C, a titanium nitride film is then deposited on the core material 14 and on the amorphous hafnium oxide film 13b to which silicon is added, and a cell gate electrode 15 made of a titanium nitride film and having a width of about 10 nm is then formed on the sidewall of the core material 14 by a known dry etching technique. Further, the core material 14 and the cell gate electrode 15 are used as masks to introduce a phosphorus element by the ion implantation method, so that a diffusion layer 16 is formed in a surface layer of the semiconductor substrate 11.

As shown in FIG. 6D, the core material 14 and the cell gate electrode 15 are used as masks to further add, by the ion implantation method, a nitrogen element to an exposed region of the amorphous hafnium oxide film (amorphous hafnium silicate film) 13b to which silicon has been added. Here, the dose amount should be adjusted so that the concentration of the additional nitrogen element will be, for example, about 1 atomic percent. As a result, an amorphous hafnium oxide film 13d to which silicon and nitrogen are added is formed in the exposed region of the amorphous hafnium oxide film 13b to which silicon is added. The element to be added to the hafnium oxide film 13b is not limited to nitrogen, and may be carbon or may be both nitrogen and carbon. The concentrations of the additional nitrogen element and the additional carbon element have only to be 0.1 atomic percent or more. The element to be added to the hafnium oxide film 13b may be hafnium.

As shown in FIG. 6E, a phosphorus element is then selectively introduced into the select gate region by the ion implantation method to form a diffusion layer 22 in the surface layer of the semiconductor substrate 11. An interlayer insulating film 17 made of a silicon oxide film is then formed on the core material 14, the cell gate electrode 15, and the hafnium oxide film 13d. Lamp heating at about 1000° C. is then conducted to activate the diffusion layers 16 and 22 and at the same time crystallize the hafnium oxide films 13a, 13b, and 13d. Here, the hafnium oxide films 13a, 13b, and 13d are covered with various materials and are thus subjected to stress. Therefore, the hafnium oxide film 13b under the cell gate electrode 15 becomes an orthorhombic silicon-containing hafnium oxide film and serves as a ferroelectric insulating film 18. The hafnium oxide film 13a under the core material 14 becomes a cubic or monoclinic hafnium oxide film and serves as an insulating film 19 having a dielectric constant of about 20. The hafnium oxide film 13d in other regions becomes an orthorhombic nitrogen-added hafnium silicate film and serves as a high dielectric-constant insulating film 20 having a dielectric constant of about 30. The additional nitrogen element acts as a fixed charge impurity that inhibits polarization, and therefore does not show significant ferroelectricity.

As shown in FIG. 6F, the interlayer insulating film 17 in the select gate region is then selectively removed, and a trench 21 is formed. The surface layer of the semiconductor substrate 11 is then counter-doped with boron by the ion implantation method, and converted to a p-type. Further, the trench 21 is filled with a titanium nitride film serving as a select gate electrode 23. A surface layer of the titanium nitride film is then planarized by a chemical mechanical polishing method, and the select gate electrode 23 is formed in the trench 21. A flat NAND memory cell string is then completed by a known wiring formation method.

A ferroelectric memory formed by the manufacturing method (2) has the following configuration.

As shown in FIG. 6F, the gate insulating film 13 (18, 19, 20) is not divided and continuously formed in the cell gate region, the inter-adjacent-cell-gate region, and the select gate region.

Here, the gate insulating film 18 in the cell gate region is formed by a hafnium oxide film in which the number of Si atoms/(the number of Hf atoms+the number of Si atoms) is 0.03, and is orthorhombic and ferroelectric. The gate insulating film 19 at one end (under the core material 14) of the cell gate electrode 15 in the inter-adjacent-cell-gate region is formed by a hafnium oxide film, is a cubic or monoclinic and nonferroelectric insulating film having a dielectric constant of about 20. The gate insulating film 20 at the other end (under the interlayer insulating film 17) of the cell gate electrode 15 in the inter-adjacent-cell-gate region and the gate insulating film 20 in the select gate region are formed by orthorhombic nitrogen-added hafnium silicate films, and are nonferroelectric high dielectric-constant insulating films having a dielectric constant of about 30.

In other words, the gate insulating film 18 in the cell gate region has a ferroelectric crystal structure, and the gate insulating films 19 and 20 in the inter-adjacent-cell-gate region and the select gate region have nonferroelectric crystal structures. The gate insulating film 19 contains no nitrogen, and the gate insulating film 20 contains nitrogen, so that these gate insulating films are formed by different materials.

In the process of the cell gate electrode 15, one upper end (upper end on the side opposite to the core material 14) of the cell gate electrode 15 is rounded. The upper surface of the select gate electrode 23 is higher than the upper surface of the cell gate electrode 15.

According to the manufacturing method (2) described above, in contrast with the previous manufacturing method (1), no nitrogen element is added to the gate insulating films 20 in the inter-adjacent-cell-gate region and the select gate region. The nitrogen element acts as a fixed charge impurity that inhibits polarization, and therefore does not show ferroelectricity as is shown in the gate insulating film 18 in the cell gate region. Thus, according to the manufacturing method (2), advantageous effects similar to those according to the manufacturing method (1) can be obtained.

[1-5] Manufacturing Method (3)

A manufacturing method (3) of the flat ferroelectric memory according to the first embodiment is described with reference to FIGS. 7A, 7B, and 7C.

First, as shown in FIG. 7A, an interfacial insulating film 12 made of a silicon oxide film having a thickness of about 1 nm is formed on a semiconductor substrate 11 made of a p-type silicon substrate, and an amorphous hafnium oxide film 13a (gate insulating film 13) having a thickness of about 5 nm is formed on the interfacial insulating film 12. Titanium nitride having a thickness of about 20 nm is then deposited on the amorphous hafnium oxide film 13a. A plurality of cell gate electrodes 15 are then formed in the memory cell region by a known lithographic technique and dry etching technique, and a select gate electrode 23 is formed in the select gate region (or peripheral circuit region). Here, the width of each of the cell gate electrodes 15 is about 10 nm, and the distance between the cell gate electrodes 15 is about 10 nm. The width of the select gate electrode 23 is about 30 nm.

As shown in FIG. 7B, the cell gate electrode 15 and the select gate electrode 23 are then used as masks to introduce a phosphorus element by the ion implantation method, so that diffusion layers 16 and 22 are formed in a surface layer of the semiconductor substrate 11. Further, the cell gate electrode 15 and the select gate electrode 23 are used as masks to add a silicon element to the amorphous hafnium oxide film 13a by an oblique ion implantation method.

Here, the silicon element is more easily added to the amorphous hafnium oxide film 13a which is not covered with the cell gate electrode 15 and the select gate electrode 23 than to the amorphous hafnium oxide film 13a which is covered with the cell gate electrode 15 and the select gate electrode 23. The silicon element is also more easily added to the amorphous hafnium oxide film 13a under the narrow cell gate electrode 15 than to the amorphous hafnium oxide film 13a under the wide cell gate electrode 15.

This fact is utilized. Accordingly, the number of Si atoms to be added/(the number of Hf atoms+the number of Si atoms) is about 0.03 in the gate insulating film 13b in the cell gate region. The number of Si atoms to be added/(the number of Hf atoms+the number of Si atoms) is about 0.1 in the gate insulating film 13e in the inter-adjacent-cell-gate region. The ion implantation angle and the dose amount are adjusted so that no silicon element is added to the center of the gate insulating film 13a in the select gate region. Moreover, oblique ion implantation of the silicon element is added to the peripheral portion of the select gate electrode 23.

As shown in FIG. 7C, an interlayer insulating film 17 made of a silicon oxide film is then formed on the cell gate electrode 15, the select gate electrode 23, and the hafnium oxide film 13d. Lamp heating at about 1000° C. is then conducted to activate the diffusion layers 16 and 22 and at the same time crystallize the hafnium oxide films 13a, 13b, and 13e. Here, the hafnium oxide films 13a, 13b, and 13e are covered with various materials and are thus subjected to stress. Therefore, the hafnium oxide film 13b under the cell gate electrode 15 becomes an orthorhombic silicon-containing hafnium oxide film and serves as a ferroelectric insulating film 18. The hafnium oxide film 13e between the adjacent cell gate electrodes 15 becomes a cubic or monoclinic silicon-containing hafnium oxide film and serves as a high dielectric-constant insulating film 20 having a dielectric constant of about 30. The center of the gate insulating film 13a under the select gate electrode 23 becomes a cubic or monoclinic hafnium oxide film and serves as an insulating film 19 having a dielectric constant of about 20. A flat NAND memory cell string is then completed by a known wiring formation method.

A ferroelectric memory formed by the manufacturing method (3) has the following configuration.

As shown in FIG. 7C, the gate insulating film 13 (18, 19, 20) is not divided and continuously formed in the cell gate region, the inter-adjacent-cell-gate region, and the select gate region.

Here, the gate insulating film 18 in the cell gate region is formed by a hafnium oxide film in which the number of Si atoms/(the number of Hf atoms+the number of Si atoms) is 0.03, and is orthorhombic and ferroelectric. The gate insulating film 20 in the inter-adjacent-cell-gate region is formed by a hafnium oxide film in which the number of Si atoms/(the number of Hf atoms+the number of Si atoms) is 0.1, and is a nonferroelectric high dielectric-constant insulating film 20 having a dielectric constant of about 30. The gate insulating film 19 under the center of the select gate electrode 23 in the select gate region is formed by a hafnium oxide film, and is a cubic or monoclinic nonferroelectric insulating film having a dielectric constant of about 20.

In other words, the gate insulating film 18 in the cell gate region has a ferroelectric crystal structure, and the gate insulating films 19 and 20 in the inter-adjacent-cell-gate region and the select gate region have nonferroelectric crystal structures. The gate insulating film 19 is a high dielectric-constant film, and the gate insulating film 20 is a paraelectric film.

According to the manufacturing method (3) described above, advantageous effects similar to those according to the manufacturing method (1) can be obtained.

In the manufacturing method (3) described above, perpendicular ion implantation of a silicon element may be further conducted after the oblique ion implantation shown in FIG. 7B. In this way, the silicon element is further added to the gate insulating film 13e in the inter-adjacent-cell-gate region, and a hafnium silicate film 20 in which the number of Si atoms/(the number of Hf atoms+the number of Si atoms) is 0.5 or more can be formed.

In this case, the dielectric constant of the gate insulating film 20 in the inter-adjacent-cell-gate region is reduced by 10% or more as compared with the dielectric constant of the gate insulating film 18 in the cell gate region. Thus, it is also possible to avoid any wrong memory operation resulting from a threshold variation (what is known as an inter-cell interference effect) of a cell transistor caused by a leakage electric field from the adjacent cell gate electrode 15. This is advantageous to the miniaturization of a memory cell string.

[1-6] Manufacturing Method (4)

A manufacturing method (4) of the flat ferroelectric memory according to the first embodiment is described with reference to FIGS. 8A, 8B, and 8C.

Figure 8A:
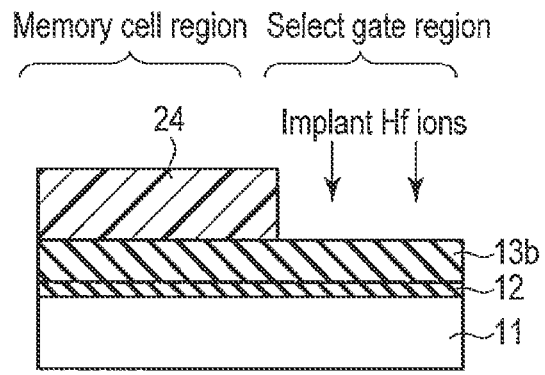
FIGS. 8A, 8B, and 8C are one example of a sectional view showing a manufacturing method (4) of the flat NAND type ferroelectric memory according to the first embodiment.

First, as shown in FIG. 8A, an interfacial insulating film 12 made of a silicon oxide film having a thickness of about 1 nm is formed on a semiconductor substrate 11 made of a p-type silicon substrate, and an amorphous hafnium silicate film 13b which has a thickness of about 5 nm and in which the number of Si atoms/(the number of Hf atoms+the number of Si atoms) is 0.03 is formed on the interfacial insulating film 12. A memory cell region is then covered with a resist mask 24. A hafnium element in which the number of Hf atoms/(the number of Hf atoms+the number of Si atoms) is about 0.05 is then added to the hafnium silicate film 13b in the select gate region (or peripheral circuit region) by the ion implantation method. Thus, the hafnium silicate film 13b is transformed into the oxygen-deficient hafnium silicate film 13e having an oxygen element concentration lower than a stoichiometric coefficient. The resist mask 24 is then removed.

Figure 8B:
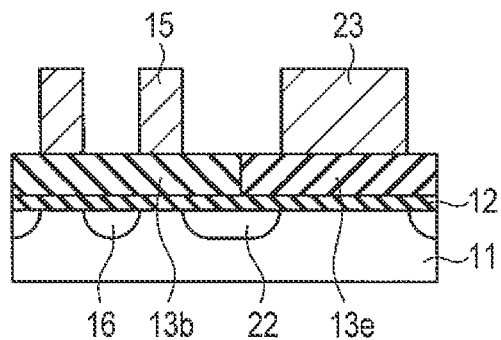

As shown in FIG. 8B, titanium nitride having a thickness of about 20 nm is then deposited on the hafnium silicate films 13b and 13e. A plurality of cell gate electrodes 15 are then formed in the memory cell region by a known lithographic technique and dry etching technique, and a select gate electrode 23 is formed in the select gate region. Here, the width of each of the cell gate electrodes 15 is about 10 nm, and the distance between the cell gate electrodes 15 is about 10 nm. The width of the select gate electrode 23 is about 30 nm. The cell gate electrode 15 and the select gate electrode 23 are then used as masks to introduce a phosphorus element by the ion implantation method, so that diffusion layers 16 and 22 are formed in a surface layer of the semiconductor substrate 11.

Figure 8C:
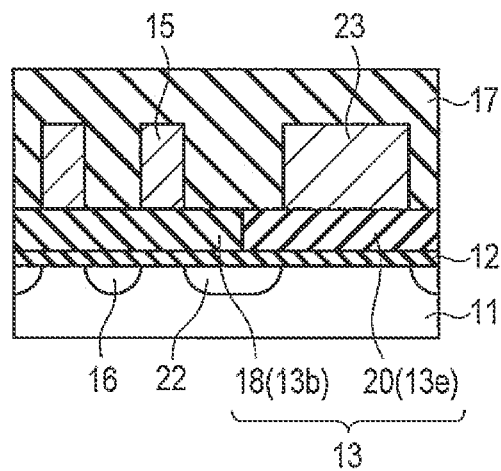

As shown in FIG. 8C, an interlayer insulating film 17 made of a silicon oxide film is then formed on the cell gate electrode 15, the select gate electrode 23, and the hafnium silicate films 13b and 13e. Lamp heating at about 1000° C. is then conducted to activate the diffusion layers 16 and 22 and at the same time crystallize the hafnium silicate films 13b and 13e. Here, the hafnium silicate films 13b and 13e are covered with various materials and are thus subjected to stress. Therefore, the hafnium oxide film 13b under the cell gate electrode 15 becomes an orthorhombic hafnium silicate film and serves as a ferroelectric insulating film 18. The hafnium silicate film 13e under the select gate electrode 23 becomes an orthorhombic oxygen-deficient hafnium silicate film and serves as a high dielectric-constant insulating film 20 having a dielectric constant of about 30. The high dielectric-constant insulating film 20 has an oxygen element concentration lower than a stoichiometric coefficient, and is in an oxygen-deficient state. Therefore, the high dielectric-constant insulating film 20 has its polarization inhibited, and thus shows no significant ferroelectricity.

A ferroelectric memory formed by the manufacturing method (4) has the following configuration.

As shown in FIG. 8C, the gate insulating film 13 (18, 20) is not divided and continuously formed in the memory cell region and the select gate region.

Here, the gate insulating film 18 in the memory cell region is formed by a hafnium oxide film in which the number of Si atoms/(the number of Hf atoms+the number of Si atoms) is 0.03, and is orthorhombic and ferroelectric. The gate insulating film 20 in the select gate region is formed by an orthorhombic oxygen-deficient hafnium silicate film, and is a nonferroelectric high dielectric-constant insulating film 20 having a dielectric constant of about 30. In other words, the gate insulating film 18 in the memory cell region has a ferroelectric crystal structure, and the gate insulating film 20 in the select gate region and has a nonferroelectric crystal structure.

According to the manufacturing method (4) described above, no polarization is caused immediately under the select gate electrode 23 by an electric field during the operation of the select gate transistor, and any wrong memory operation can therefore be avoided. Further, the gate insulating film 20 in the select gate region has a high dielectric property, so that the width of the select gate electrode 23 can be reduced.

In the manufacturing method (4) described above, hafnium ion implantation may be further conducted after the formation of the cell gate electrode 15 shown in FIG. 8B. If the gate insulating film in the inter-adjacent-cell-gate region is transformed into a hafnium silicate film so that the content of oxygen therein is lower than that of the gate insulating film in the cell gate region and so that the relation O/(Hf+Si)<2 is satisfied, the polarization of the gate insulating film in the inter-adjacent-cell-gate region is suppressed, and any wrong memory operation can be avoided at the same time.

In the manufacturing method (4) described above, perpendicular ion implantation of a silicon element may be further conducted after the formation of the cell gate electrode 15 shown in FIG. 8B. The gate insulating film in the inter-adjacent-cell-gate region may be transformed into a hafnium silicate film in which the number of Si atoms/(the number of Hf atoms+the number of Si atoms) is 0.5 or more. In this case, the dielectric constant of the gate insulating film in the inter-adjacent-cell-gate region is reduced by 10% or more as compared with the dielectric constant of the gate insulating film in the cell gate region. Thus, it is also possible to avoid any wrong memory operation resulting from a threshold variation (what is known as an inter-cell interference effect) of a cell transistor caused by a leakage electric field from the adjacent cell gate electrode 15. This is therefore advantageous to the miniaturization of a memory cell string.

[1-7] Advantageous Effects

In the structure of a conventional ferroelectric memory that uses a ferroelectric HfO film, a ferroelectric insulating film is divided into cells in the channel length direction, and the end of the ferroelectric insulating film is located immediately under the end of a gate electrode. As the crystallinity of the end region of the ferroelectric insulating film is modified by a physical or chemical damage in a transistor manufacturing process, desired polarization characteristics are not developed, and wrong memory operation occurs. This phenomenon is more significant if the dimension of the gate electrode is miniaturized to, for example, about 10 nm.

On the other hand, in order to avoid the wrong memory operation, the ferroelectric insulating film should not be divided into cells. However, when ferroelectric memory transistors are connected in series to configure a memory cell string structure as in a NAND type memory, the ferroelectric insulating film in a region between the adjacent transistors is polarized by a leakage electric field from an adjacent transistor electrode, which causes wrong memory operation.

According to the first embodiment, the NAND memory cell string structure is formed so that the gate insulating film 13 is formed without being divided into cells. Moreover, the gate insulating film 13 under the cell gate electrode 15 has a ferroelectric crystal structure (orthorhombic crystal), and the gate insulating film 13 in at least one of the inter-adjacent-cell-gate region and the select gate region has a nonferroelectric crystal structure. Therefore, parasitic polarization between adjacent cells and wrong polarization of a select gate insulating film can be inhibited, and wrong memory operation can be avoided. Consequently, memory characteristics can be improved.

The flat NAND memory cell string according to the first embodiment is also applicable when an n-type diffusion layer is provided on the surface of a p-type semiconductor layer and when no diffusion layer is provided on the p-type semiconductor layer.

[2] Second Embodiment

A ferroelectric memory according to the second embodiment has a 3D structure type NAND memory cell string structure.

[2-1] Structure A

A structure A of 3D structure type ferroelectric memory according to the second embodiment is described with reference to FIG. 9.

As shown in FIG. 9, cell gate electrodes 15 and interlayer insulating films 17 are alternately stacked, and a trench 25 which passes through this stack structure is provided. A gate insulating film 13 and an interfacial insulating film 12 are stacked on the inner wall of the trench 25, and the core of the trench 25 is filled with an n-type semiconductor layer 11.

Furthermore, on the stack structure comprising the cell gate electrodes 15 and the interlayer insulating films 17, the select gate electrode 23 is provided across an interlayer insulating film 17 having a thickness of about 30 nm. The core of the trench 25 in a select gate region comprises a p-type semiconductor layer 27. High-concentration n-type diffusion layers 22 are formed in the core of the trench 25 in the regions of both ends of the p-type semiconductor layer 27.

Here, the cell gate electrode 15 and the select gate electrode 23 are formed by, for example, tungsten (or titanium nitride). The interlayer insulating film 17 is formed by, for example, a silicon oxide film. The diameter of the trench 25 is about 30 nm. The gate insulating film 13 includes, as the main component, hafnium oxide having a thickness of about 5 nm. The interfacial insulating film 12 is formed by, for example, a silicon oxide film having a thickness of about 1 nm.

The gate insulating film 13 in the structure A according to the second embodiment is not divided into cells, and is continuously formed in a cell gate region, an inter-adjacent-cell-gate region, and the select gate region. However, a gate insulating film 18 (13) in the cell gate region has a ferroelectric crystal structure, and the gate insulating films 20 (13) in the inter-adjacent-cell-gate region and the select gate region have nonferroelectric crystal structures.

Specifically, the gate insulating film 18 in the cell gate region is configured so that the number of Si atoms/(the number of Hf atoms+the number of Si atoms) is 0.02 or more and 0.05 or less, and is orthorhombic and ferroelectric. The gate insulating film 20 in the inter-adjacent-cell-gate region is an insulating film in which the number of Si atoms/(the number of Hf atoms+the number of Si atoms) is less than 0.02 or more than 0.05 and which does not show ferroelectricity. Therefore, as there is no polarization of the gate insulating film 20 in the inter-adjacent-cell-gate region caused by a leakage electric field during writing/erasing, any wrong memory operation can be avoided.

The gate insulating film 20 in the select gate region is an insulating film in which the number of Si atoms/(the number of Hf atoms+the number of Si atoms) is less than 0.02 or more than 0.05 and which does not show ferroelectricity. Therefore, as no polarization is caused immediately under the select gate electrode 23 by an electric field during the operation of the select gate electrode 23, any wrong memory operation can be avoided.

The example of the gate insulating film 13 described in connection with the structure A of the flat ferroelectric memory according to the first embodiment is also applicable to the structure A according to the second embodiment.

Figure 10A:
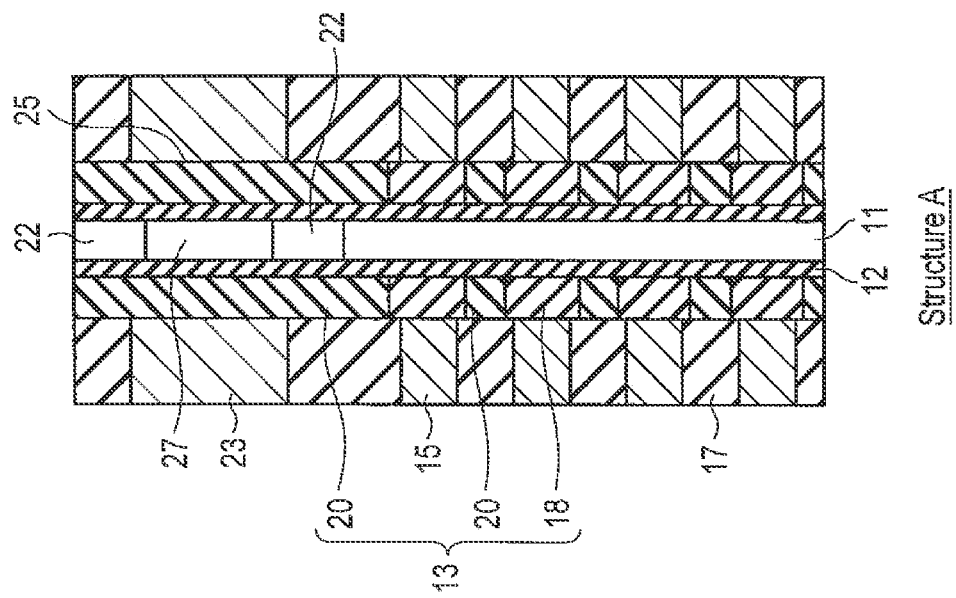
FIGS. 10A and 10B are one example of a sectional view showing a modification of the structure A of the BiCS type ferroelectric memory according to the second embodiment.
Figure 10B:
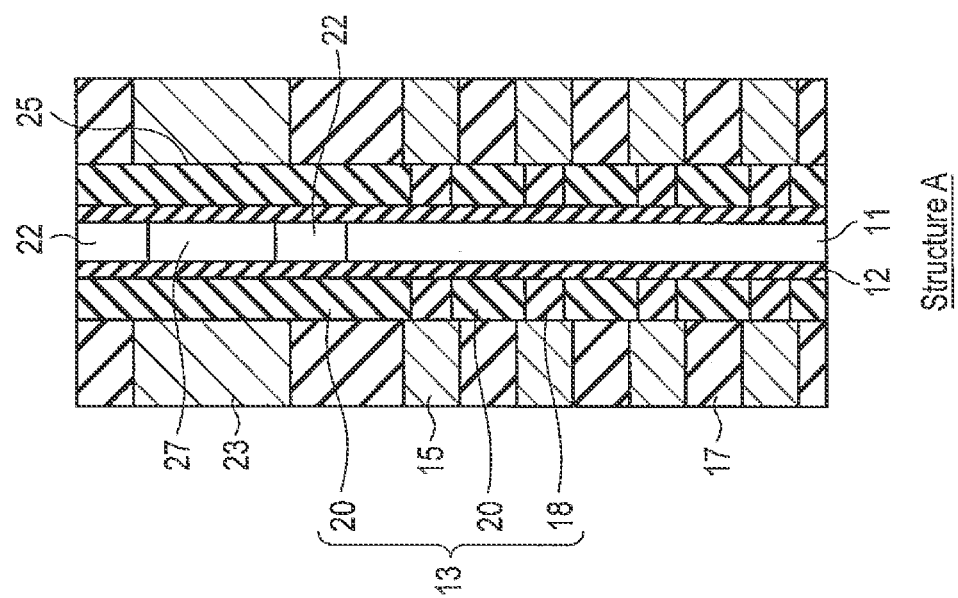

The boundary between the gate insulating film 18 and the gate insulating film 20 may correspond to the side surface of the cell gate electrode 15, or may be located inside or outside the side surface of the cell gate electrode 15, as shown in FIGS. 10A and 10B.

[2-2] Structure B

A structure B of the 3D structure type ferroelectric memory according to the second embodiment is described with reference to FIG. 11. Similarities between the structure A and the structure B are not described.

Figure 11:
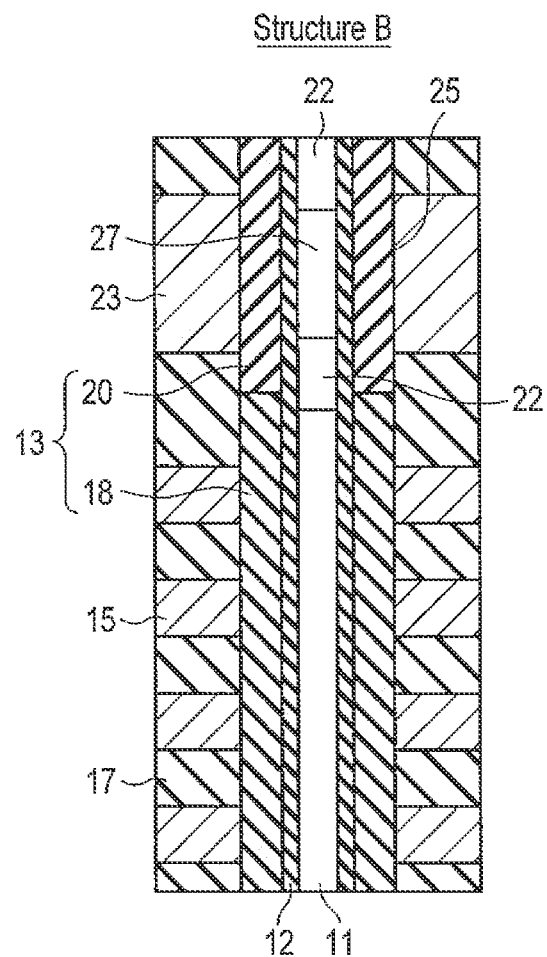
FIG. 11 is one example of a sectional view showing a structure B of the BiCS type ferroelectric memory according to the second embodiment.

As shown in FIG. 11, the structure B is different from the structure A in that both (memory cell regions) of the gate insulating film 18 in the cell gate region and the gate insulating film 18 in the inter-adjacent-cell-gate region have ferroelectric crystal structures and in that the gate insulating film 20 in the select gate region has a nonferroelectric crystal structure.

A gate insulating film 13 in the structure B according to the second embodiment is not divided into cells, and is continuously formed in the memory cell region and the select gate region. However, the gate insulating film 18 (13) in the memory cell region has a ferroelectric crystal structure, and the gate insulating film 20 (13) in the select gate region has a nonferroelectric crystal structure.

Specifically, the gate insulating film 18 in the memory cell region is configured so that the number of Si atoms/(the number of Hf atoms+the number of atoms) is 0.02 or more and 0.05 or less, and is orthorhombic and ferroelectric. The gate insulating film 20 in the select gate region is configured so that the number of Si atoms/(the number of Hf atoms+the number of Si atoms) is 0.06 or more and 0.3 or less, and has a high-dielectric constant. Therefore, the gate insulating film 20 can obtain a dielectric constant which is 20 percent or more higher than that when no silicon element is contained. It is thus possible to avoid a short channel effect of the select gate transistor and also reduce the width of the select gate electrode 23. That is, it is possible to avoid any wrong memory operation resulting from polarization immediately under the select gate electrode 23 and at the same time miniaturize the memory cell string.

The example of the gate insulating film described in connection with the structure B of the flat ferroelectric memory according to the first embodiment is also applicable to the structure B according to the second embodiment.

The boundary between the gate insulating film 18 and the gate insulating film 20 may correspond to the side surface of the select gate electrode 23 on the side of the cell gate electrode 15 (shown in FIG. 12A), or may be located inside (shown in FIG. 12B) or outside (shown in FIG. 11) the side surface of the select gate electrode 23 on the side of the cell gate electrode 15.

[2-3] Manufacturing Method

A manufacturing method of the 3D structure type ferroelectric memory according to the second embodiment is described with reference to FIGS. 13A, 13B, and 13C.

Figure 13B:
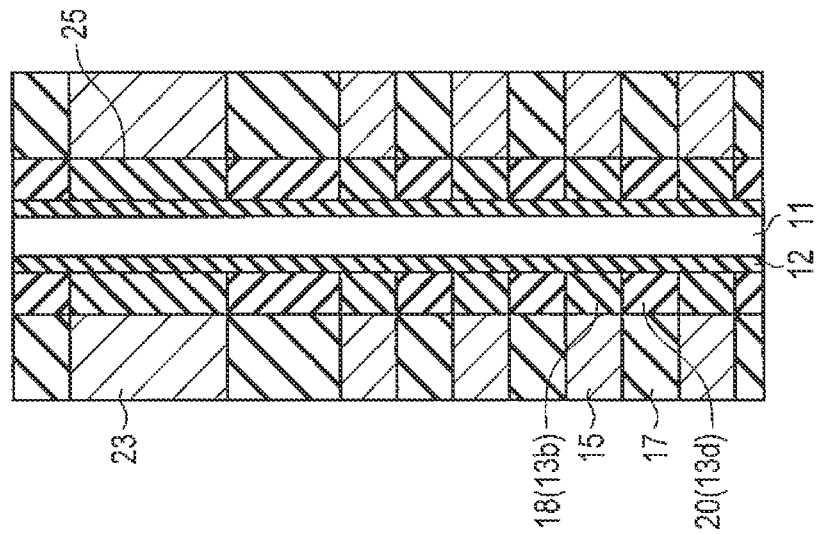
FIGS. 13A, 13B, 13C, and 13D are one example of a sectional view showing a manufacturing method of the BiCS type ferroelectric memory according to the second embodiment.
Figure 13A:
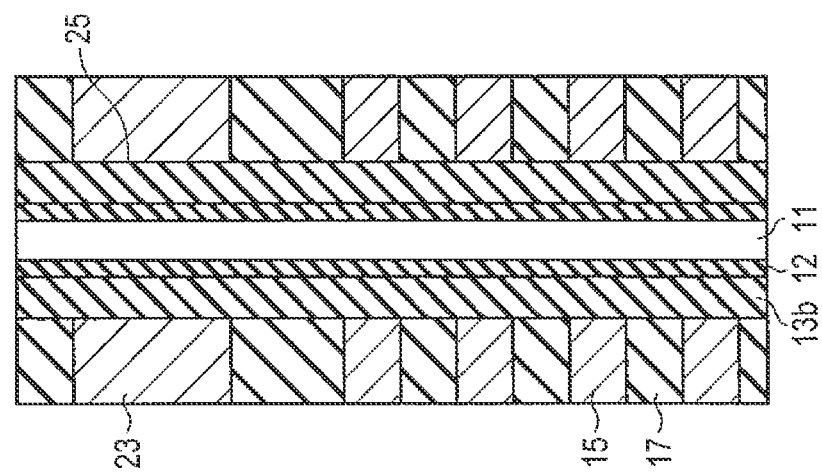

First, as shown in FIG. 13A, a cell gate electrode 15 made of tungsten having a thickness of about 10 nm and an interlayer insulating film 17 made of a carbon-added silicon oxide film having a thickness of about 10 nm are alternately stacked by a chemical vapor method. A select gate electrode 23 made of tungsten having a thickness of about 30 nm is stacked across an interlayer insulating film 17, and a multilayer stack structure is formed. Here, a silicon oxide film to which about 10 atomic percent of a carbon element is added by the adjustment of film formation temperature using an organic silicon source gas is used as the interlayer insulating film 17.

A trench 25 of about 30 nm in diameter which passes through the multilayer stack structure is then formed by the dry etching method. A silicon-added amorphous hafnium oxide film (amorphous hafnium silicate film) 13b having a thickness of about 5 nm is then formed on the inner wall of the trench 25 by a chemical vapor deposition method. Here, the flow volume of the silicon source gas is adjusted so that the number of Si atoms to be added/(the number of Hf atoms+the number of Si atoms) will be, for example, 0.02 to 0.05, preferably, about 0.03. Further, a silicon oxide film having a thickness of about 1 nm to be an interfacial insulating film 12 is formed on the inner wall of the trench 25 by the chemical vapor deposition method. The core of the trench 25 is then filled with a semiconductor layer 11 made of phosphorus-doped n-type silicon, and a channel layer is formed.

As shown in FIG. 13B, heating is then conducted at about 600 to 800° C. As a result, a carbon element is diffused from the interlayer insulating film 17 to the part of the hafnium silicate film 13b in contact with the interlayer insulating film 17, and this part is transformed into a hafnium silicate film 13d to which about 1 atomic percent of the carbon element is added. Further, lamp heating at about 1000° C. is conducted, and the hafnium silicate films 13b and 13d are crystallized. Here, the hafnium silicate films 13b and 13d are covered with various materials and are thus subjected to stress. Therefore, the part in contact with the cell gate electrode 15 and the select gate electrode 23 becomes an orthorhombic silicon-containing hafnium oxide film and serves as a ferroelectric insulating film 18. In the meantime, the part in contact with the interlayer insulating film 17 becomes an orthorhombic carbon-added hafnium silicate film and serves as a high dielectric-constant insulating film 20 having a dielectric constant of about 30. Here, the additional carbon element acts as a fixed charge impurity that inhibits polarization, and therefore does not show significant ferroelectricity.

Figure 13C:
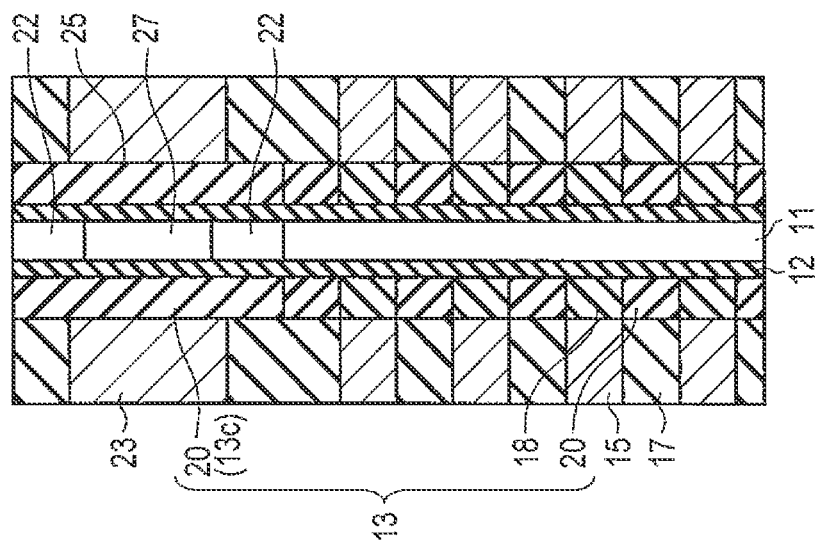
Figure 13D:
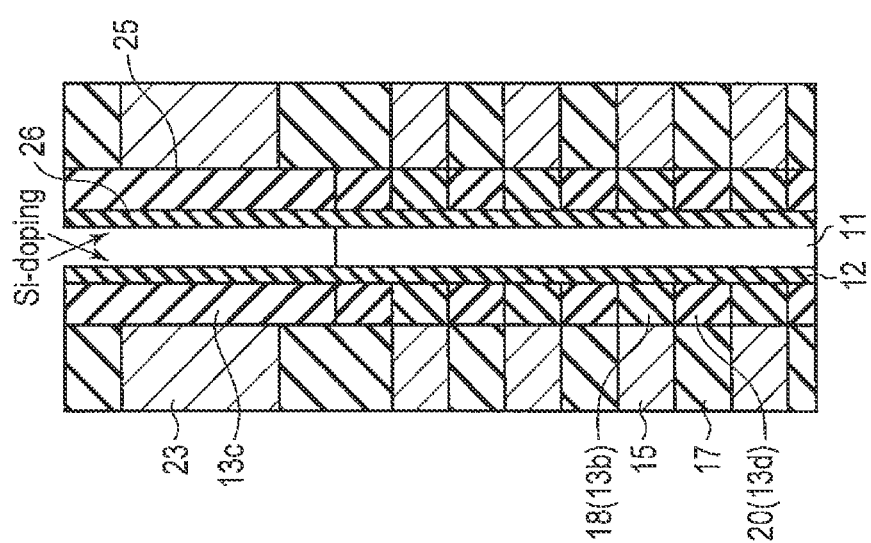

As shown in FIG. 13C, an exposed portion of the semiconductor layer 11 is selectively removed by the dry etching method. As a result, the semiconductor layer 11 in the select gate region is removed, and a trench 26 having a depth of about 50 is formed. A silicon element is further added to the orthorhombic hafnium silicate films 13b and 13d facing the trench 26 by the oblique ion implantation method. Here, the dose amount is adjusted so that the total of the number of Si atoms to be added/(the number of Hf atoms+the number of Si atoms) will be, for example, about 0.2. The hafnium silicate films 13b and 13d are formed into an amorphous state by the silicon ion implantation. The element to be added to the hafnium silicate films 13b and 13d is not limited to silicon, and may be hafnium, nitrogen, or carbon.

The trench 26 is then sequentially filled with a high-concentration phosphorus-doped silicon layer serving as an n+ diffusion layer 22 of a select gate transistor, a low-concentration boron-doped silicon layer serving as a p-type channel layer 27, and a high-concentration phosphorus-doped silicon layer serving as an n+ diffusion layer 22. Lamp heating at about 1000° C. is then conducted, and the hafnium silicate films 13b and 13d facing the trench 26 are recrystallized. The hafnium silicate films 13b and 13d in the select gate region become cubic or monoclinic hafnium silicate films and serve as high dielectric-constant insulating films 20 having a dielectric constant of about 30.

[2-4] Advantageous Effects

According to the second embodiment described above, memory characteristics can be improved as in the first embodiment. That is, in the memory cell string according to the present embodiment, there is no polarization of the inter-adjacent-cell-gate region caused by a leakage electric field from the cell gate electrode 15 during writing/erasing, so that any wrong memory operation can be avoided. As no polarization is caused immediately under the select gate electrode 23 by an electric field during the operation of the select gate electrode, any wrong memory operation can be avoided. Moreover, the gate insulating film in the region of the select gate electrode 23 has a high dielectric property, so that the width of the select gate electrode 23 can be reduced.

Furthermore, according to the second embodiment, the ferroelectric memory transistors are vertically stacked, which allows higher integration.

According to the second embodiment, the carbon element is diffused to the inter-adjacent-cell-gate region to avoid the development of the ferroelectricity in this region. However, similar advantageous effects are provided if a nitrogen-containing film is used as the interlayer insulating film 17 to diffuse the nitrogen element.

Although the hafnium oxide film is used as the gate insulating film 13 in the first and second embodiments, zirconium oxide may be used instead. Although silicon is used as the element to be added to the gate insulating film 13, magnesium may be used instead. That is, the gate insulating film 13 includes a metal which is hafnium (Hf) or zirconium (Zr) and oxygen as the main components, and an element selected from the group consisting of silicon (Si), magnesium (Mg), aluminum (Al), and yttrium (Y) may be added to the gate insulating film 13.

The gate insulating film 13 in the select gate region in the first and second embodiments is also applicable to the gate insulating film in the peripheral circuit region.

[3] Third Embodiment

The third embodiment improves the controllability of individual cell transistors by dividing a ferroelectric film in adjacent cells in a channel width direction.

[3-1] Structure A

Figure 14:
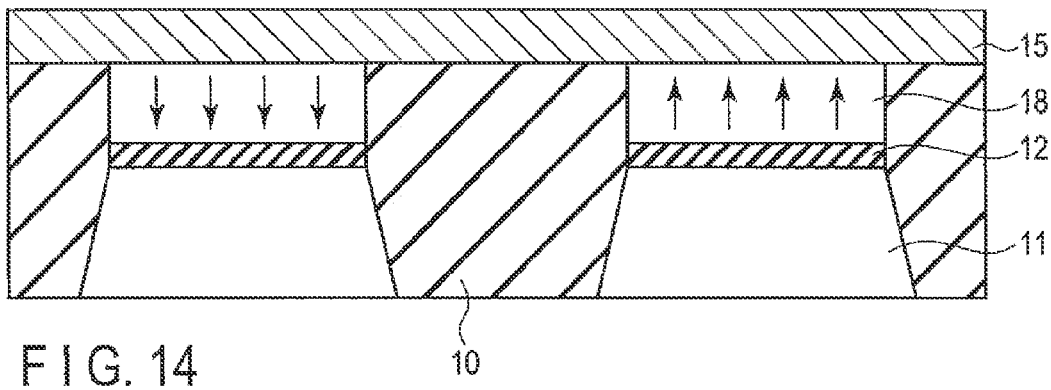
FIG. 14 is one example of a sectional view showing a structure A of a ferroelectric memory according to a third embodiment.

A structure A of a ferroelectric memory according to the third embodiment is described with reference to FIG. 14. FIG. 14 is a sectional view in the channel width direction (word line direction).

As shown in FIG. 14, an interfacial insulating film 12 is formed on a semiconductor layer (semiconductor substrate) 11. A ferroelectric film 18 is formed on the interfacial insulating film 12. A gate electrode 15 is formed on the ferroelectric film 18. The interfacial insulating film 12 may be eliminated, and the ferroelectric film 18 may be formed directly on the semiconductor layer 11. However, the formation of the interfacial insulating film 12 improves the carrier mobility of the channel and enables a faster operation.

Here, the semiconductor layer 11, the interfacial insulating film 12, and the ferroelectric film 18 are divided into the adjacent cells in the channel width direction. An element isolation insulating film 10 is formed between the divided parts. The gate electrode 15 is continuously formed in the channel width direction, and is not divided into cells.

The ferroelectric film 18 is a film including a metal (e.g. hafnium (Hf) or zirconium (Zr)) and oxygen as the main components, and includes an element (e.g. silicon (Si), magnesium (Mg), aluminum (Al), or yttrium (Y)) other than the above metal so that the concentration of this element is lower than that of the above metal. The ferroelectric film 18 is made of, for example, an HfSiOx film, a ZrSiOx film, an HfMgOx film, or a ZrMgOx film.

When the ferroelectric film 18 is the HfSiOx film, the number of Si atoms/(the number of Hf atoms+the number of Si atoms) in the HfSiOx film is preferably 0.02 or more and 0.05 or less.

In the structure A according to the third embodiment, the ferroelectric film 18 is divided into the adjacent cells in the channel width direction. Therefore, this structure is not easily affected by the polarization of the adjacent cells. That is, the controllability of the polarization of the cells is higher.

[3-2] Structure B

Figure 15:
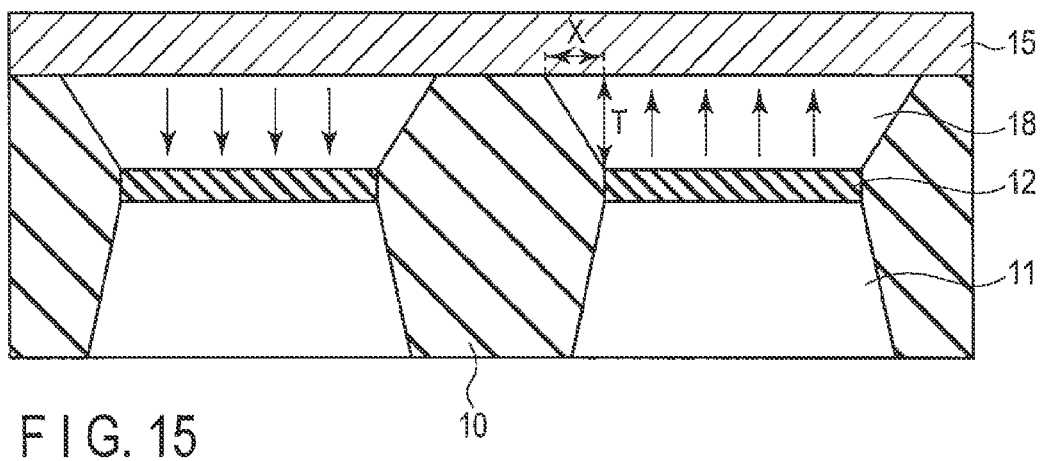
FIG. 15 is one example of a sectional view showing a structure B of the ferroelectric memory according to the third embodiment.

A structure B of the ferroelectric memory according to the third embodiment is described with reference to FIG. 15. FIG. 15 is a sectional view in the channel width direction (word line direction).

As shown in FIG. 15, the structure B is different from structure A in that the ferroelectric film 18 formed on the side of the gate electrode 15 is wider than the ferroelectric film 18 formed on the side of the semiconductor layer 11 in the channel width direction. That is, the ferroelectric film 18 in the structure B has a protrusion at the upper end.

A width X of the protrusion satisfies, for example, the relation $0<X<½T$. Here, T is the thickness of the ferroelectric film 18. The protrusion of the ferroelectric film 18 is not limited to this relation. It is only necessary that the protrusion of the ferroelectric film 18 do not contact the protrusion of the ferroelectric film 18 of the adjacent cell and that the space under the protrusion of the ferroelectric film 18 can be filled with the element isolation insulating film 10.

In the structure B according to the third embodiment, the protrusion is provided in the upper layer of the ferroelectric film 18, so that the gate electrode 15 dominates the entire region in the channel width direction. Therefore, the controllability of the inversion of a channel can be improved by a voltage applied to the gate electrode 15.

[3-3] Structure C

Figure 16:
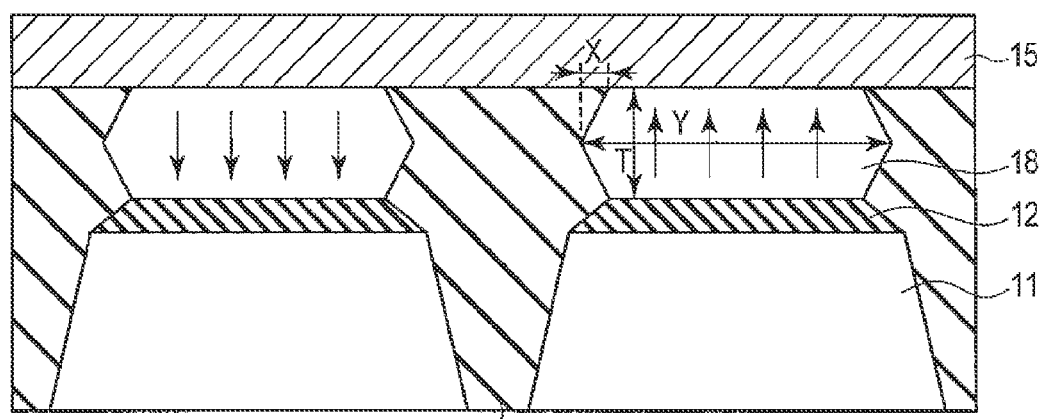
FIG. 16 is one example of a sectional view showing a structure C of the ferroelectric memory according to the third embodiment.

A structure C of the ferroelectric memory according to the third embodiment is described with reference to FIG. 16. FIG. 16 is a sectional view in the channel width direction (word line direction).

As shown in FIG. 16, the structure C is different from the structure A in that the width of the ferroelectric film 18 is maximized in the vicinity of the center in the thickness direction and in that the maximum value is lower than the channel width. Thus, in the structure C, a protrusion is provided in the center of the thickness direction of the ferroelectric film 18.

A width X of the protrusion of the ferroelectric film 18 satisfies, for example, the relation $0<X<½T$. Here, T is the thickness of the ferroelectric film 18. The protrusion of the ferroelectric film 18 is not limited to this relation. It is only necessary that the polarization properties of the ferroelectric film 18 can be maintained, that the protrusion of the ferroelectric film 18 do not contact the protrusion of the ferroelectric film 18 of the adjacent cell, and that the space under the protrusion of the ferroelectric film 18 can be filled with the element isolation insulating film 10.

A width Y of the ferroelectric film 18 in the channel width direction is smaller than the channel width (the width of the uppermost surface of the semiconductor layer 11 in the channel width direction).

In the structure C according to the third embodiment, the protrusion is provided in the center of the thickness direction of the ferroelectric film 18. Therefore, both ends of the ferroelectric film 18 in the channel width direction are always off, so that the polarization is more stable.

The ferroelectric film 18 does not exclusively have the maximum width in the center of the thickness direction in the channel width direction, and has only to have the maximum width in a part other than the upper end or the lower end in the thickness direction.

[3-4] Manufacturing Method

A manufacturing method of the structure C of the ferroelectric memory according to the third embodiment is described with reference to FIGS. 17A, 17B, and 17C.

First, as shown in FIG. 17A, an interfacial insulating film 12 is formed on a semiconductor layer 11, and a ferroelectric film 18 is formed on the interfacial insulating film 12. The ferroelectric film 18 is a film which includes Hf or Zr and oxygen as the main components and to which Si, Mg, Al, or Y is added. The concentration of Si, Mg, Al, or Y in the lower layer of the ferroelectric film 18 is higher than concentration of Si, Mg, Al, or Y in the upper layer of the ferroelectric film 18. The ferroelectric film 18, the interfacial insulating film 12, and the semiconductor layer 11 are then fabricated, for example, by anisotropic etching having slight isotropy, and an element isolation trench 10a is formed. In this case, the ferroelectric film 18 has an inverse tapered structure.

As shown in FIG. 17B, the ferroelectric film 18 is then side-etched by the use of, for example, a hydrofluoric acid. As a result, the end of the upper layer of the ferroelectric film 18 is removed, and the center of the ferroelectric film 18 is formed into a protruding shape.

As shown in FIG. 17C, the element isolation trench 10a is then filled with the element isolation insulating film 10. The element isolation insulating film 10 is planarized, and the ferroelectric film 18 is exposed.

When the structure A is formed, the fabrication by anisotropic etching in the process shown in FIG. 17A may follow the process shown in FIG. 17C. When the structure B is formed, the process shown in FIG. 17A may follow the process shown in FIG. 17C.

[3-5] Advantageous Effects

In a conventional ferroelectric memory that uses a ferroelectric HfO film, a ferroelectric film is not divided into cells but is continuously formed in the channel width direction. The phenomenon is that the control of the individual cells is unstable under the influence of the polarization of the adjacent cells in the channel width direction.

In contrast, according to the third embodiment, the ferroelectric film is divided into the cells adjacent in the channel width direction. Thus, the controllability of the individual cell transistors can be improved. Accordingly, memory characteristics can be improved.

Although the ferroelectric film 18 according to the third embodiment is divided into cells in the channel width direction, the ferroelectric film 18 may be divided into the adjacent cells or continuously formed in the channel length direction.

[4] Fourth Embodiment

The fourth embodiment improves the controllability of multivalued operation by providing regions having interfacial insulating films of different thickness in cells.

[4-1] Structure A

Figure 18:
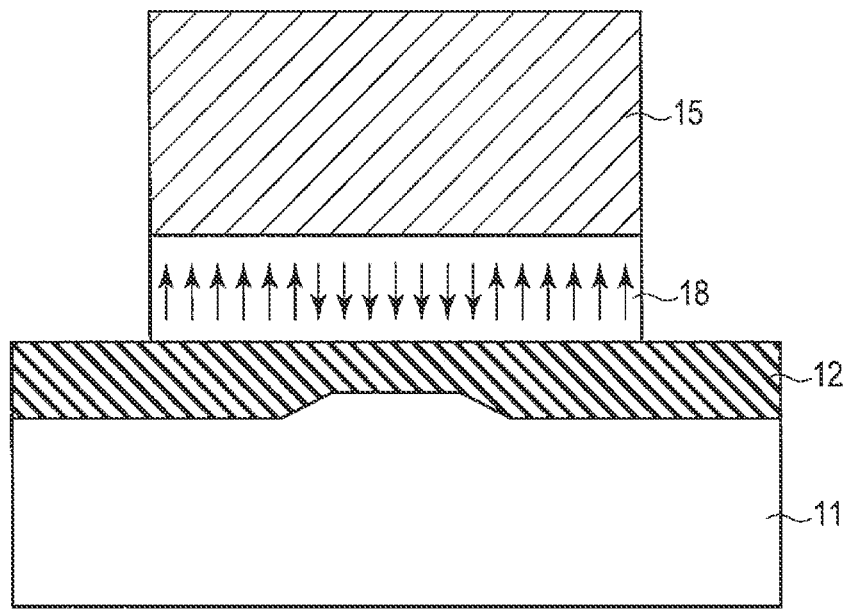
FIG. 18 is one example of a sectional view showing a structure A of a ferroelectric memory according to a fourth embodiment.

A structure A of a ferroelectric memory according to the fourth embodiment is described with reference to FIG. 18. FIG. 18 is a sectional view in the channel length direction (bit line direction).

As shown in FIG. 18, an interfacial insulating film 12 is formed on a semiconductor layer (semiconductor substrate) 11. A ferroelectric film 18 is formed on the interfacial insulating film 12. A gate electrode 15 is formed on the ferroelectric film 18.

In the channel length direction, the thickness of the interfacial insulating film 12 under the end of the gate electrode 15 is greater than the thickness of the interfacial insulating film 12 under the center (channel center) of the gate electrode 15. The thickness of the interfacial insulating film 12 under the end of the gate electrode 15 is only greater downward. That is, the upper surface of the interfacial insulating film 12 under the end of the gate electrode 15 substantially corresponds to the upper surface of the interfacial insulating film 12 under the center (channel center) of the gate electrode 15, and the bottom surface of the interfacial insulating film 12 under the end of the gate electrode 15 is lower than the bottom surface of the interfacial insulating film 12 under the center (channel center) of the gate electrode 15. The interfacial insulating film 12 is made of, for example, $SiO_2$, SiON, or SiN.

The interfacial insulating film 12 and the ferroelectric film 18 have three regions A, B, and C. The regions A and B are the ends of the ferroelectric film 18 where the thickness of the interfacial insulating film 12 is great. The region C is the center of the ferroelectric film 18 where the thickness of the interfacial insulating film 12 is small.

The ferroelectric film 18 is a film including a metal (e.g. hafnium (Hf) or zirconium (Zr)) and oxygen as the main components, and includes an element (e.g. silicon (Si), magnesium (Mg), aluminum (Al), or yttrium (Y)) other than the above metal so that the concentration of this element is lower than that of the above metal. The ferroelectric film 18 is made of, for example, an HfSiOx film, a ZrSiOx film, an HfMgOx film, or a ZrMgOx film.

When the ferroelectric film 18 is the HfSiOx film, the number of Si atoms/(the number of Hf atoms+the number of Si atoms) in the HfSiOx film is preferably 0.02 or more and 0.05 or less.

[4-2] Structure B

Figure 19:
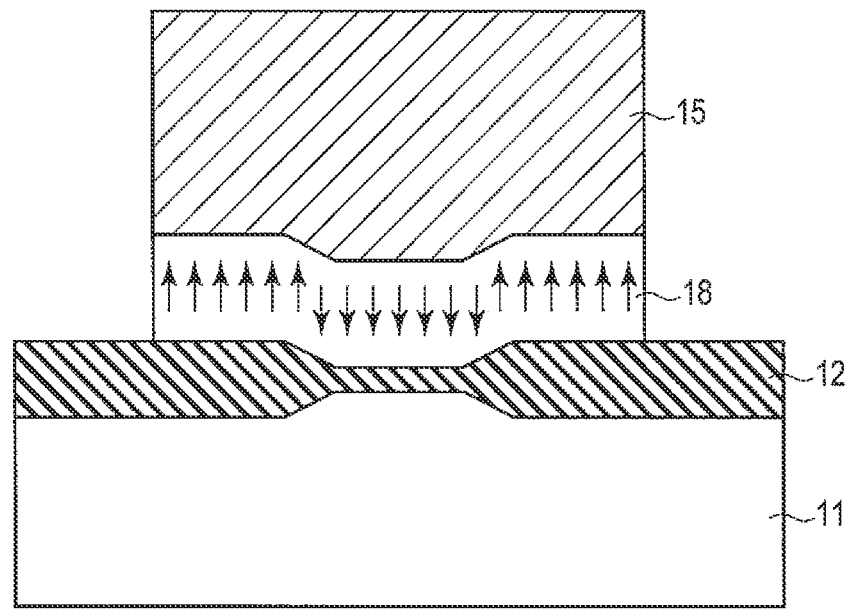
FIG. 19 is one example of a sectional view showing a structure B of the ferroelectric memory according to the fourth embodiment.

A structure B of the ferroelectric memory according to the fourth embodiment is described with reference to FIG. 19. FIG. 19 is a sectional view in the channel length direction (bit line direction).

As shown in FIG. 19, in the channel length direction, the thickness of the interfacial insulating film 12 under the end of the gate electrode 15 is greater than the thickness of the interfacial insulating film 12 under the center (channel center) of the gate electrode 15.

Here, the structure B is different from structure A in that the thickness of the interfacial insulating film 12 is greater upward and downward. That is, the upper surface of the interfacial insulating film 12 under the end of the gate electrode 15 is higher than the upper surface of the interfacial insulating film 12 under the center (channel center) of the gate electrode 15, and the bottom surface of the interfacial insulating film 12 under the end of the gate electrode 15 is lower than the bottom surface of the interfacial insulating film 12 under the center (channel center) of the gate electrode 15.

Both ends of the ferroelectric film 18 are higher than the center of the ferroelectric film 18. However, the thickness of both ends of the ferroelectric film 18 is substantially equal to the thickness of the center of the ferroelectric film 18. The ferroelectric film 18 and the interfacial insulating film 12 in the structure B also have three regions A, B, and C as in the structure A.

[4-3] Manufacturing Method

The ferroelectric memory according to the fourth embodiment is formed as below.

First, an interfacial insulating film 12 is formed on a semiconductor layer (semiconductor substrate) 11. A ferroelectric film 18 is formed on the interfacial insulating film 12. A gate electrode 15 is formed on the ferroelectric film 18. The gate electrode 15 and the ferroelectric film 18 are then fabricated into desired shapes. For example, fluorine (F) is then implanted, and the thickness of the interfacial insulating film 12 under the end of the gate electrode 15 is increased.

[4-4] Polarization

The polarization of the ferroelectric memory according to the fourth embodiment is described with reference to FIGS. 20A and 20B.

First, in an initial condition, all the polarization directions of the regions A, B, and C in the ferroelectric film 18 are upward. The regions A and B are the ends of the ferroelectric film 18 where the thickness of the interfacial insulating film 12 is great. The region C is the center of the ferroelectric film 18 where the thickness of the interfacial insulating film 12 is small.

When a voltage is applied to the gate electrode 15 in the polarized ferroelectric memory, the polarization of the ferroelectric film 18 in the region C where the thickness of the interfacial insulating film 12 is small is first only inverted, as shown in FIG. 20A. That is, in this stage, the polarization of the ferroelectric film 18 remains upward in the regions A and B, and changes to the downward direction in the region C. If the voltage applied to the gate electrode 15 is then increased, the polarization of the ferroelectric film 18 is inverted in the regions A and B where the thickness of the interfacial insulating film 12 is great, and changes to the downward direction, as shown in FIG. 20B.

Thus, in the ferroelectric memory according to the fourth embodiment, the interfacial insulating film 12 varies in thickness so that the polarization of the ferroelectric film 18 in the region C where the thickness of the interfacial insulating film 12 is small is inverted by a lower voltage than the polarization of the ferroelectric film 18 in the regions A and B where the thickness of the interfacial insulating film 12 is great. That is, the ferroelectric film 18 in the region C is different in inversion threshold voltage from the ferroelectric film 18 in the regions A and B. Thus, it is possible to obtain a distribution of two different polarization with high reproducibility and stabilize the multivalued operation by the control of the applied gate voltage.

[4-5] Advantageous Effects

The phenomenon with a conventional ferroelectric memory that uses a ferroelectric HfO film is that the multivalued operation necessary for increased storage density cannot be performed with high controllability.

In contrast, according to the fourth embodiment, the regions having the interfacial insulating films 12 of different thickness are provided in the cell in the channel length direction, and the controllability of the multivalued operation can be improved accordingly. Therefore, memory characteristics can be improved.

[5] Fifth Embodiment

The fifth embodiment can improve the controllability of multivalued operation by providing regions having ferroelectric films of different thickness in cells.

[5-1] Structure

Figure 21A:
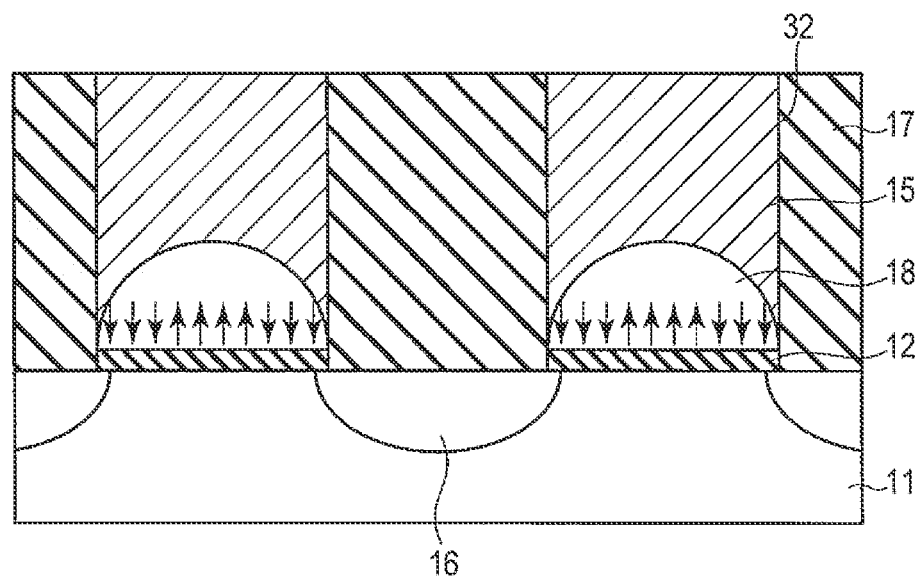
FIGS. 21A and 21B are one example of a sectional view and a plan view showing the structure of a ferroelectric memory according to a fifth embodiment.

The structure of a ferroelectric memory according to the fifth embodiment is described with reference to FIGS. 21A and 21B. FIG. 21A is a sectional view in the channel length direction (bit line direction).

Figure 21B:
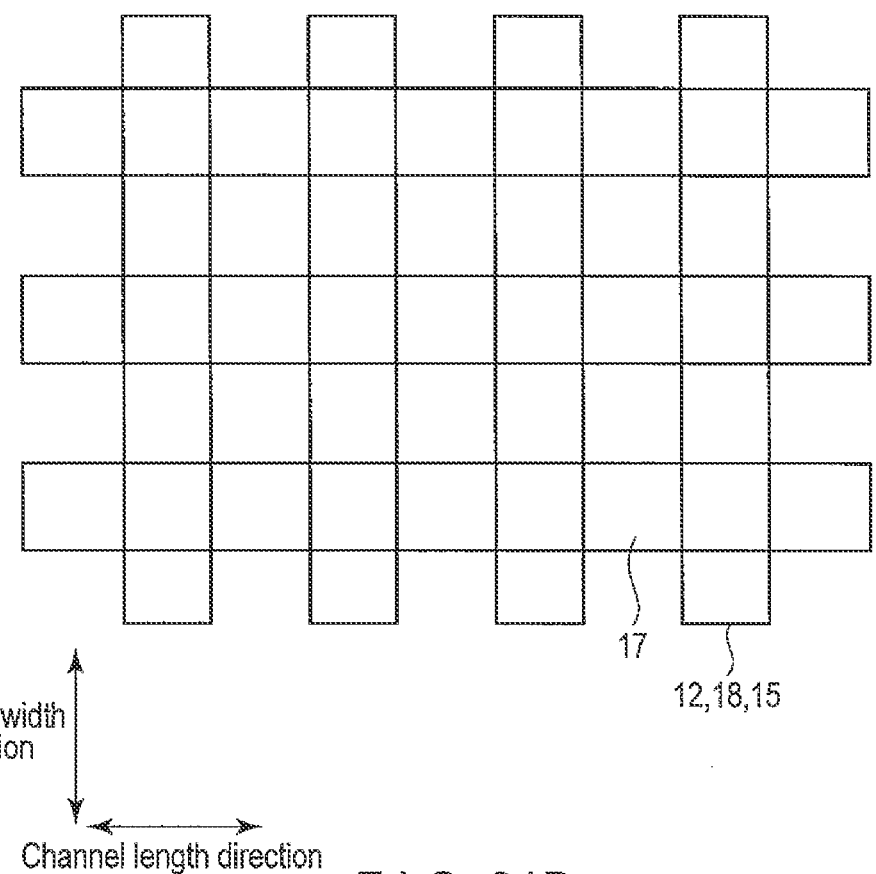

FIG. 21B is a plan view.

As shown in FIG. 21A, an interfacial insulating film 17 is formed on a semiconductor layer 11 (semiconductor substrate). A trench 32 is formed in the interfacial insulating film 17. An interfacial insulating film 12 is formed on the bottom surface of the trench 32, and a ferroelectric film 18 is formed on the interfacial insulating film 12. A gate electrode 15 is formed on the ferroelectric film 18, and the trench 32 is filled with the gate electrode 15.

Here, the ferroelectric film 18 varies in thickness in the channel length direction. That is, the thickness of the center of the ferroelectric film 18 is greater than the thickness of the end of the ferroelectric film 18.

The ferroelectric film 18 is a film including a metal (e.g. hafnium (Hf) or zirconium (Zr)) and oxygen as the main components, and includes an element (e.g. silicon (Si), magnesium (Mg), aluminum (Al), or yttrium (Y)) other than the above metal so that the concentration of this element is lower than that of the above metal. The ferroelectric film 18 is made of, for example, an HfSiOx film, a ZrSiOx film, an HfMgOx film, or a ZrMgOx film.

When the ferroelectric film 18 is the HfSiOx film, the number of Si atoms/(the number of Hf atoms+the number of Si atoms) in the HfSiOx film is preferably 0.02 or more and 0.05 or less.

As shown in FIG. 21B, the ferroelectric film 18 is divided into cells in the channel length direction, but is continuously formed over the adjacent cells in the channel width direction. That is, the ferroelectric film 18 varies in thickness in the cell in the channel length direction.

[5-2] Manufacturing Method

A manufacturing method of the ferroelectric memory according to the fifth embodiment is described with reference to FIGS. 22A, 22B, 22C, 22D, and 22E.

Figure 22A:
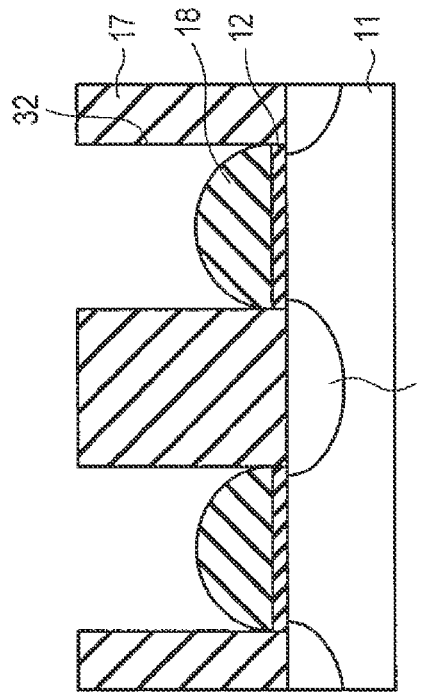
FIGS. 22A, 22B, 22C, and 22D are one example of a sectional view showing a manufacturing method of the ferroelectric memory according to the fifth embodiment.

First, as shown in FIG. 22A, a dummy gate pattern 31 is formed on a semiconductor substrate 11, and the dummy gate pattern 31 is patterned into a desired shape. A diffusion layer 16 is then formed in the semiconductor substrate 11 under both ends of the dummy gate pattern 31. An element isolation insulating film 17 is then formed on the semiconductor substrate 11 and the dummy gate pattern 31, and the space around the dummy gate pattern 31 is filled with the element isolation insulating film 17. The element isolation insulating film 17 is then planarized, and the upper surface of the dummy gate pattern 31 is exposed.

Figure 22C:
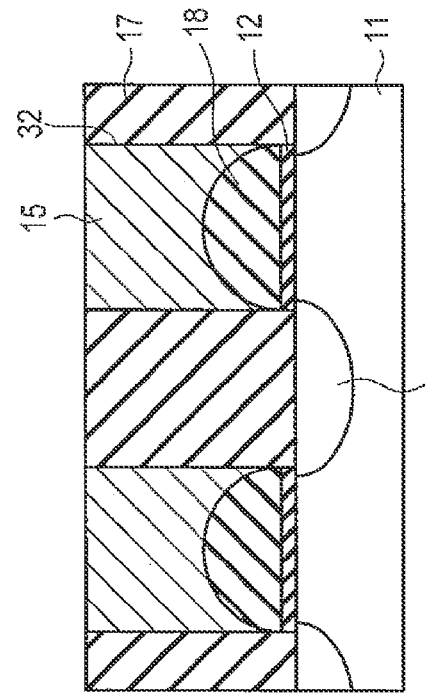
Figure 22B:
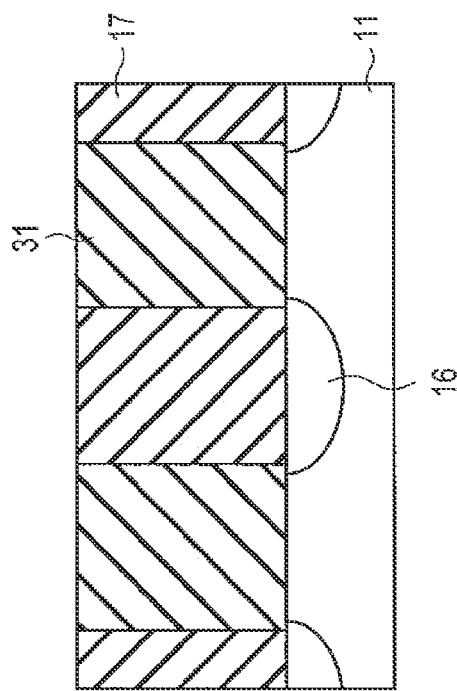

As shown in FIG. 22B, the dummy gate pattern 31 is removed, and the upper surface of the semiconductor substrate 11 is exposed. As a result, a trench 32 is formed.

As shown in FIG. 22C, the semiconductor substrate 11 on the bottom surface of the trench 32 is then oxidized, and the interfacial insulating film 12 is formed. A ferroelectric film 18 is then formed on the interfacial insulating film 12 in the trench 32, for example, by PVD. In this case, the ferroelectric film 18 is formed with a great thickness in the center of the trench 32, and formed with a small thickness at the end of the trench 32.

Figure 22D:
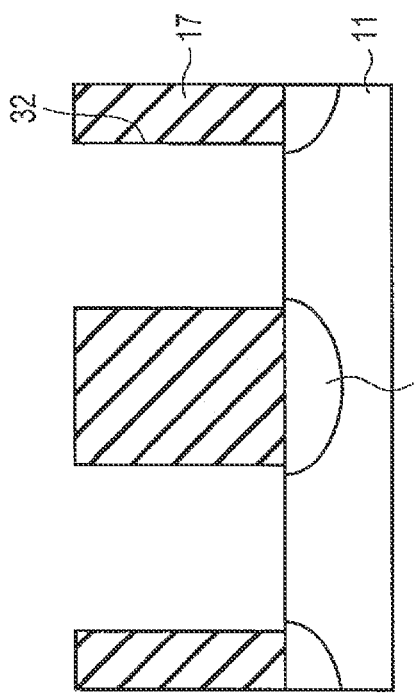

As shown in FIG. 22D, a gate electrode 15 is then formed on the ferroelectric film 18, and the trench 32 is filled with the gate electrode 15.

[5-3] Polarization

The polarization of the ferroelectric memory according to the fifth embodiment is described with reference to FIGS. 23A and 23B.

First, in an initial condition, the polarization directions of all regions in the ferroelectric film 18 having a thickness variation are upward.

When a voltage is applied to the gate electrode 15 in the polarized ferroelectric memory, the polarization at the end of the ferroelectric film 18 having a small thickness is only inverted, as shown in FIG. 23A. That is, in this stage, the polarization of the ferroelectric film 18 changes at the end, and remains upward in the center. If the voltage applied to the gate electrode 15 is then increased, the polarization at the center of the ferroelectric film 18 having a great thickness is inverted, and changes to downward polarization, as shown in FIG. 23B.

Thus, in the ferroelectric memory according to the fifth embodiment, the ferroelectric film 18 varies in thickness so that the polarization in the end region of the ferroelectric film 18 having a small thickness is inverted by a lower voltage than the polarization in the central region of the ferroelectric film 18 having a great thickness. That is, the end region of the ferroelectric film 18 is different in inversion threshold voltage from the central region of the ferroelectric film 18. Thus, it is possible to obtain a distribution of two different polarization with high reproducibility and stabilize the multivalued operation by the control of the applied gate voltage.

[5-4] Advantageous Effects

According to the fifth embodiment described above, the regions having the ferroelectric films 18 of different thickness are provided in the cell so that the controllability of the multivalued operation can be improved. Therefore, memory characteristics can be improved.

[6] Sixth Embodiment

The sixth embodiment changes the polarization amount of a ferroelectric film in the channel length direction and thereby enables capacity increase by multiple values.

[6-1] Structure

The structure of a ferroelectric memory according to the sixth embodiment is described with reference to FIG. 24 to FIG. 26. According to the present embodiment, a ferroelectric gate structure having an HfSiOx-based ferroelectric film is provided in a gate structure part of a CMOS.

Figure 24:
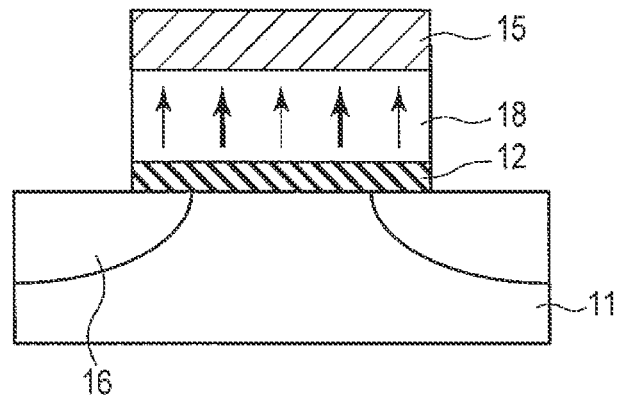
FIG. 24 is one example of a sectional view showing a structure A of a ferroelectric memory according to a sixth embodiment.
Figure 25:
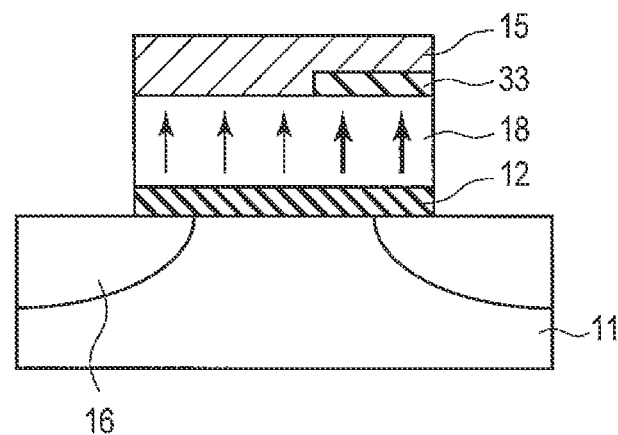
FIG. 25 is one example of a sectional view showing a structure B of the ferroelectric memory according to the sixth embodiment.

As shown in FIG. 24 and FIG. 25, an interfacial insulating film 12 is formed on a semiconductor substrate 11. A ferroelectric film 18 is formed on the interfacial insulating film 12. A gate electrode 15 is formed on the ferroelectric film 18. Diffusion layers 16 are formed in the semiconductor substrate 11 under both ends of the gate electrode 15. Thus, a ferroelectric gate structure is formed.

The ferroelectric film 18 is a film including a metal (e.g. hafnium (Hf) or zirconium (Zr)) and oxygen as the main components, and includes an element (e.g. silicon (Si), magnesium (Mg), aluminum (Al), or yttrium (Y)) other than the above metal so that the concentration of this element is lower than that of the above metal. The ferroelectric film 18 is made of, for example, an HfSiOx film, a ZrSiOx film, an HfMgOx film, or a ZrMgOx film.

When the ferroelectric film 18 is the HfSiOx film, the number of Si atoms/(the number of Hf atoms+the number of Si atoms) in the HfSiOx film is preferably 0.02 or more and 0.05 or less.

This ferroelectric film 18 is thermally treated and crystallized into a ferroelectric film structure in an inert gas, for example, at about 1000° C. The crystallized ferroelectric film 18 shows an orthorhombic structure, and its remanent polarization shows a ferroelectricity of about 10 to 20 uC/cm². In some gate stack structures and thermal treatment processes, the ferroelectric film 18 is not formed into an orthorhombic ferroelectric substance, and is crystallized into a cubic or monoclinic form, so that a process adjustment is needed.

In the present embodiment, the polarization amount of the ferroelectric film 18 under the gate electrode 15 has a distribution that varies in a source/drain direction (channel length direction). That is, the ferroelectric film 18 under the gate electrode 15 comprises polarizations varying in coercive electric field in the channel length direction. Details of the configuration are as below.

As shown in FIG. 24, in the structure A, the ferroelectric film 18 is formed by, for example, an HfSiOx film, a ZrSiOx film, an HfMgOx film, or a ZrMgOx film. When the ferroelectric film 18 is the HfSiOx film or the ZrSiOx film, the concentration of Si varies in the channel length direction. When the ferroelectric film 18 is the HfMgOx film or the ZrMgOx film, the concentration of Mg varies in the channel length direction. Here, the number of Si atoms/(the number of Hf atoms+the number of Si atoms) in the ferroelectric film 18 should be changed within a range between, for example, 0.02 or more and 0.05 or less.

As shown in FIG. 25, in the structure B, a trap film 33 is formed in at least a part between the gate electrode 15 and the ferroelectric film 18. The trap film 33 is formed by an oxide film comprising Al, Hf, Ti, or Zr (e.g. AlOx, HfOx, TiOx, or ZrOx), or by a SiN film. In the structure B, the thickness of the trap film 33 may vary in the channel length direction, or the concentration of the additional element (e.g. nitrogen (N) or carbon (O)) in the trap film 33 may vary in the channel length direction.

In the structure A and the structure B, the polarization amount or coercive voltage of the ferroelectric film 18 changes with the distribution of the concentration of Si or Mg in the ferroelectric film 18 or changes under the influence of the trap film 33. Thus, the polarization of the ferroelectric substance is inverted or switched at a plurality of voltage levels. That is, interfacial charge density changes with the polarization amount of the ferroelectric substance, and a plurality of threshold voltage levels can be set. Therefore, the voltage applied to the gate electrode 15 or the pulse width is changed to change the polarization of the ferroelectric film 18 under the gate electrode 15, thereby enabling multivalued writing by a plurality of applied voltage levels.

FIGS. 26A, 26B, 26C, 26D, 26E, 26F, and 26G show the concentration distribution of the additional element in the channel length direction. The additional element in FIGS. 26A, 26B, 26C, 26D, 26E, 26F, and 26G are Si or Mg added to the ferroelectric film 18 in the structure A, and corresponds to the element added to the trap film 33 in the structure B.

Figures 26A, 26B, 26C, 26D:
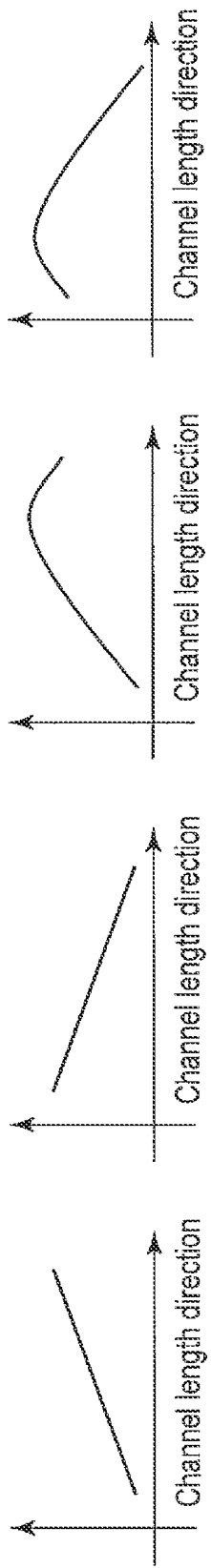
FIGS. 26A, 26B, 26C, 26D, 26E, 26F, and 26G are one example of a diagram showing the concentration distribution of an additional element in a channel length direction in the ferroelectric memory according to the sixth embodiment.
Figures 26E, 26F, 26G:
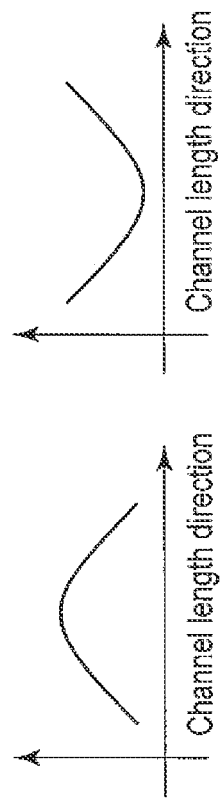

As shown in FIGS. 26A and 26B, the concentration of the additional element may constantly increase or decrease in the channel length direction. As shown in FIGS. 26C, 26D, 26E, and 26F, the maximum or minimum peak of the additional element concentration may be located in the film in the channel length direction. As shown in FIG. 26G, there may be a plurality of peaks of the additional element concentration in the channel length direction.

There are other ways of changing the polarization amount or coercive voltage of the ferroelectric film 18. For example, the thickness of the ferroelectric film 18 is varied in the channel length direction; a small amount of an impurity such as Al is added to the ferroelectric film 18; or an oxide film is introduced into the interface of the semiconductor substrate 11.

[6-2] Manufacturing Method

A manufacturing method of the ferroelectric memory according to the sixth embodiment is described below.

First, an interfacial insulating film 12 made of, for example, a silicon oxide film is formed on a semiconductor substrate 11 made of, for example, a silicon substrate. A ferroelectric film 18 made of, for example, an HfSiOx film is formed on the interfacial insulating film 12.

Here, the HfSiOx film which is the ferroelectric film 18 is formed by an atomic layer deposition (ALD) method. A silicon source is trisdimethylaminosilane (Tris DMAS). A hafnium source is tetrakis-ethylmethylamino hafnium (TEMAH). The ferroelectric film 18 is controlled by the cycle number of the ALD so that the number of Si atoms/(the number of Hf atoms+the number of Si atoms) will be 0.02 to 0.05. The thickness of the ferroelectric film 18 ranges from 1 nm to 20 nm, and is, for example, about 10 nm. The ferroelectric film 18 may be thermally treated, for example, densified or oxidized as needed.

A hard mask is then formed on the ferroelectric film 18. This hard mask is a stack film comprising a silicon nitride film and a silicon oxide film, and has a total thickness of about 50 to 150 nm. The silicon oxide film of the hard mask is then coated with a photoresist, and a resist is patterned by exposure drawing. The photoresist is used as an anti-etching mask to etch the silicon oxide film. After the etching, the photoresist is removed.

The silicon oxide film is then used as a mask to etch the silicon nitride film. Further, the ferroelectric film 18, the interfacial insulating film 12, and the semiconductor substrate 11 are etched. As a result, an element isolation trench for element isolation is formed. An element isolation insulating film of 200 nm to 1500 nm is then formed by a coating technique, and thereby fills the element isolation trench. The element isolation insulating film is treated under an oxygen atmosphere or steam atmosphere and thereby highly densified.

The silicon nitride film is then used as a stopper to planarize the element isolation insulating film by the chemical mechanical polishing (CMP) method. At the same time, the silicon nitride film and etching conditions having a selection ratio are used to only etch back the element isolation insulating film.

A gate electrode 15 made of, for example, TiN is then formed on the ferroelectric film 18 and the diffusion layer 16. The gate electrode 15 is patterned by exposure drawing. A source/drain diffusion layer 16 is then formed by ion implantation, and a transistor is formed.

For example, a silicon oxide film is then formed as an interlayer insulating film by plasma chemical vapor deposition (CVD). An opening is then formed in the interlayer insulating film by the lithographic method and reactive ion etching (RIE) so that the source diffusion layer 16 is exposed.

A W film for forming a contact plug is then formed in the opening under a forming gas atmosphere by a sputtering method or the CVD method. Further, the W film is planarized by chemical mechanical polishing (CMP). As a result, the contact plug that communicates with the source diffusion layer 16 is formed in the interlayer insulating film.

A CVD nitride film is then formed on the interlayer insulating film and the contact plug by the CVD method. A contact hole that communicates with the drain diffusion layer 16 is then formed, and a W film for forming an additional contact plug is formed. Further, the W film is planarized by the CMP. As a result, the contact plug that communicates with the drain diffusion layer 16 is formed.

A contact plug to be connected to the contact plug for the element portion and to the first contact plug is then formed as below. First, the interlayer insulating film is fabricated by the lithographic method and RIE. After a contact hole is formed, the contact hole is filled with Al, and CMP processing is conducted. As a result, the above-mentioned contact plug is formed.

An oxide film is then formed on the interlayer insulating film and the contact plug. The oxide film is then fabricated by the lithographic method and RIE to expose the contact plug, and a trench for forming a wiring line is formed. This trench is then filled with Al, and the wiring line is formed by CMP processing.

An insulating film is then formed on the oxide film and the wiring line. Further, the insulating film is fabricated by the lithographic method and RIE to expose the wiring line, and a via hole is formed. This via hole is then filled with Al, and a via plug is formed by CMP processing.

An oxide film is then formed on the insulating film and the via plug. The oxide film is then fabricated by the lithographic method and RIE to expose the via plug, and a trench is formed. This trench is then filled with Al, and a wiring line is formed by CMP processing.

A Cu wiring line may be formed by a damascene process. In this case, barrier films and seed layers of, for example, SiN, Ta, TaN, Ru, and Cu are formed, and a wiring line is formed by a Cu-plating embedding process.

In the present embodiment, the ferroelectric film 18 having the concentration distribution of the additional element in the channel length direction as in the structure A is formed, for example, in the following way.

(1) A part of the ferroelectric film 18 is masked by a lithographic process, and a desired element such as Si is formed into a film.

(2) After the desired element is formed into a film over the entire ferroelectric film 18, the film is patterned and thereby partly detached.

(3) A film including various concentrations of desired elements is formed on the top or bottom of the ferroelectric film 18, and the elements are thermally diffused by the use of, for example, a thermal treatment for the crystallization of the ferroelectric film 18.

(4) The gate structure is used to form a sidewall, and a desired element is formed into a film on a part of the ferroelectric film 18 by a shadowing effect.

(5) The ferroelectric film 18 is doped with a desired element in a channel direction by ion implantation to provide a concentration gradient.

(6) A desired element such as Si is contained in the gate electrode 15 on the ferroelectric film 18, or a layer containing a desired element such as Si is directly formed on the ferroelectric film 18. Si is then diffused by a thermal treatment in an inert gas at about 1000° C., and the concentration distribution of Si in HfSiOx which is the ferroelectric film 18 is thereby formed.

(7) An amorphous silicon layer is oxidized so that Si remains, and the interfacial insulating film 12 is formed. Si is then released from the interfacial insulating film 12 to the ferroelectric film 18 by a thermal treatment, and the concentration distribution of Si is provided in the ferroelectric film 18.

The above-mentioned method for the structure A can be applied to the method of forming the trap film 33 in which the additional element has a concentration distribution as in the structure B.

[6-3] Advantageous Effects

In a conventional ferroelectric memory that uses a ferroelectric HfO film, the capacity is determined by a transistor size, and a further capacity increase has been difficult.

In contrast, according to the sixth embodiment, the ferroelectric film 18 is configured by polarizations varying in coercive electric field in the channel length direction. Thus, the polarization of the ferroelectric film 18 is induced in the electric field direction in response to the application of a voltage, and the amount of a stored charge increases accordingly. If the voltage is further increased, polarization induction and polarization inversion occur in each part of the ferroelectric film 18 corresponding to a coercive voltage. The voltage applied to the gate electrode 15 is controlled by this behavior so that the charge induced at a gate interface and the polarization amount can be changed. Consequently, a ferroelectric memory having a plurality of coercive electric fields is obtained, thereby enabling multivalued recording and the improvement of memory characteristics.

The ferroelectric film 18 according to the present embodiment can be thinner than ever, and the interfacial insulating film 12 does not require any special oxide, which is suitable for micro-structures.

[7] Seventh Embodiment

In the seventh embodiment, a stress generating film (element isolation insulating film) which generates tensile stress in the polarization direction of a ferroelectric film is disposed on the side surface of the ferroelectric film.

[7-1] Structure

Figure 27A:
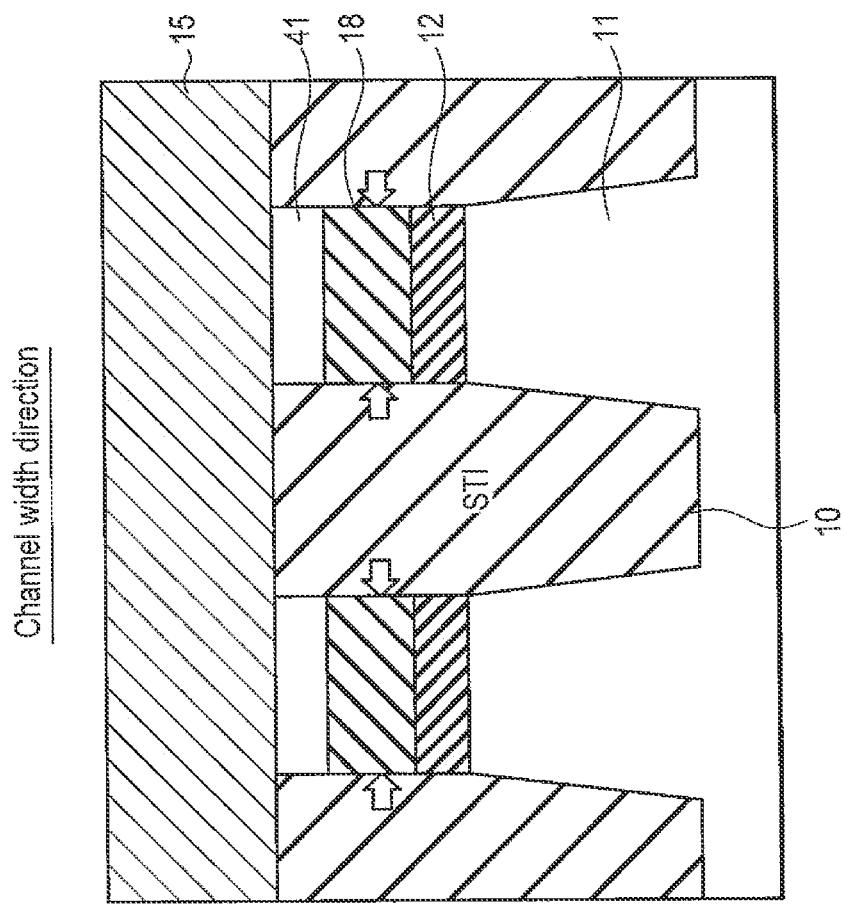
FIGS. 27A and 27B are one example of a sectional view showing the structure of a ferroelectric memory according to a seventh embodiment.
Figure 27B:
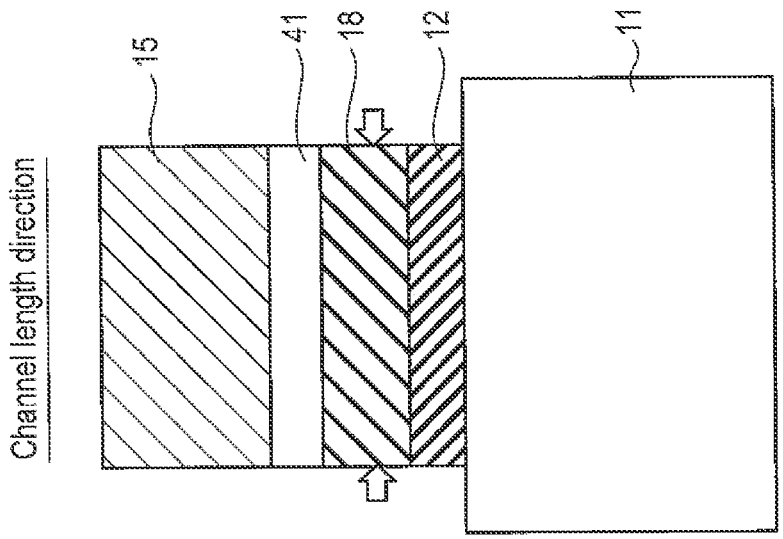

The structure of a ferroelectric memory according to the seventh embodiment is described with reference to FIGS. 27A and 27B. Here, FIG. 27A shows a sectional view in the channel width direction (word line direction). FIG. 27B shows a sectional view in the channel length direction (bit line direction).

As shown in FIGS. 27A and 27B, an element region in which a plurality of memory cells are formed is separated by an element isolation insulating film 10, and a plurality of element isolation insulating films 10 running parallel to one another are formed between a semiconductor substrate (silicon substrate) 11 and a plurality of memory cell columns. An interfacial insulating film 12 is formed on the semiconductor substrate 11. A ferroelectric film 18 is formed on the interfacial insulating film 12. A TiN film 41 is formed on the ferroelectric film 18, and a gate electrode 15 is formed on the TiN film 41.

The ferroelectric film 18 is a film including a metal (e.g. hafnium (Hf) or zirconium (Zr)) and oxygen as the main components, and includes an element (e.g. silicon (Si), magnesium (Mg), aluminum (Al), or yttrium (Y)) other than the above metal so that the concentration of this element is lower than that of the above metal. The ferroelectric film 18 is made of, for example, an HfSiOx film, a ZrSiOx film, an HfMgOx film, or a ZrMgOx film.

When the ferroelectric film 18 is the HfSiOx film, the number of Si atoms/(the number of Hf atoms+the number of Si atoms) in the HfSiOx film is preferably 0.02 or more and 0.05 or less.

In the present embodiment, the element isolation insulating film 10 which is deposited and at least expanded toward the side surface of the ferroelectric film ?13(18)? is provided. The element isolation insulating film 10 according to the present embodiment includes, for example, an $SiO_2$ film which is formed by the use of a TEOS source gas and which contains more Si than a stoichiometric composition (Si-rich TEOS).

The deposited and at least expanded element isolation insulating film 10 is provided on the side surface of the ferroelectric film 18 so that expansion stress resulting from the cubical change of the element isolation insulating film 10 can be applied toward the side surface of the ferroelectric film 18. That is, stress is applied in the compression direction of the ferroelectric film 18, and tensile stress is generated in the polarization direction of the ferroelectric film 18 in the thickness direction of the ferroelectric film 18 to lessen the stress strain. As a result, more strain is generated in the orthorhombic crystal already formed in the ferroelectric film 18, and polarizability increases. After the orthorhombic ferroelectric film 18 which develops a dielectric property is formed, the element isolation insulating film 10 is provided to apply the tensile stress inside the ferroelectric film 18 in a direction that accelerates the tensile stress from the outside. Consequently, the polarization can be maintained even after a subsequent thermal process.

[7-2] Manufacturing Method

A manufacturing method of the ferroelectric memory according to the seventh embodiment is described with reference to FIGS. 28A, 28B, 28C, 28D, 28E, 28F, and 28G.

Figure 28A:
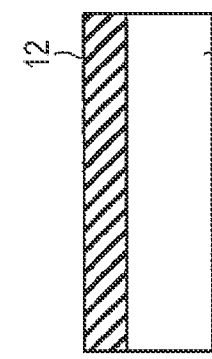
FIGS. 28A, 28B, 28C, 28D, 28E, 28F, and 28G are one example of a sectional view showing a manufacturing method of the ferroelectric memory according to the seventh embodiment.

First, as shown in FIG. 28A, an interfacial insulating film 12 made of a silicon oxide film having a thickness of about 1 nm to 10 nm is formed on a semiconductor substrate 11 made of a p-type silicon substrate (or an n-type silicon substrate on which a p-type well is formed).

Figure 28B:
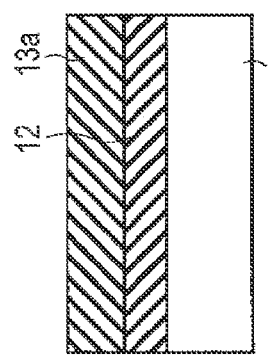

As shown in FIG. 28B, an HfSiOx film 13a to be a ferroelectric film 18 is formed on the interfacial insulating film 12 with amorphous by the atomic layer deposition (ALD) method. The thickness of the HfSiOx film 13a ranges from 5 nm to 20 nm. A hafnium silicate film is formed by the atomic layer deposition (ALD) method. A silicon source is trisdimethylaminosilane (Tris DMAS). A hafnium source is tetrakisethylmethylamino hafnium (TEMAH). The concentration of Si in the HfSiOx film 13a is controlled by the cycle number of the ALD to reach a desired concentration. Ozone is used as an oxidant, and the film formation temperature is 300° C. This ALD method is designed to form a film in an atomic layer unit by repeating a sequence including the supply of an inert gas such as ozone, purging by vacuum pumping, the supply of a source gas such as TEMAH or Tris DMAS, purging by vacuum pumping, and the resupply of an inert gas such as ozone.

It is possible to use other ways to form the hafnium silicate film in the present embodiment. The source of hafnium or silicon may be some other material, for example, some other alkylamino hafnium in which groups other than the ethylmethylamino group is bonded to the hafnium element, or hafnium halide. The oxidant may be some other material such as water, oxygen, or an oxygen radical. The film formation method is not limited to the ALD method either. For example, the chemical vapor deposition (CVD) method, a physical vapor deposition (PVD) method that uses physical excitation, or a coating method may be used instead.

Figure 28C:
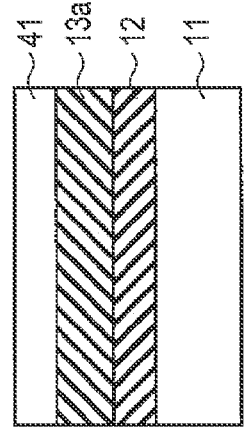

As shown in FIG. 28C, a TiN film 41 is then formed on the top of the amorphous HfSiOx film 13a.

Figure 28D:
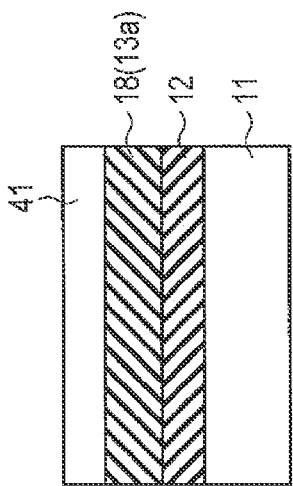

As shown in FIG. 28D, a thermal treatment, for example, at about 1000° C. is then conducted while the surface of the amorphous HfSiOx film 13a is being fixed. Thus, the HfSiOx film 13a is crystallized, and the orthorhombic ferroelectric film 18 is formed. Although the thermal process for the crystallization may be conducted after gate fabrication, the crystallization is conducted first in the example shown here.

Figure 28E:
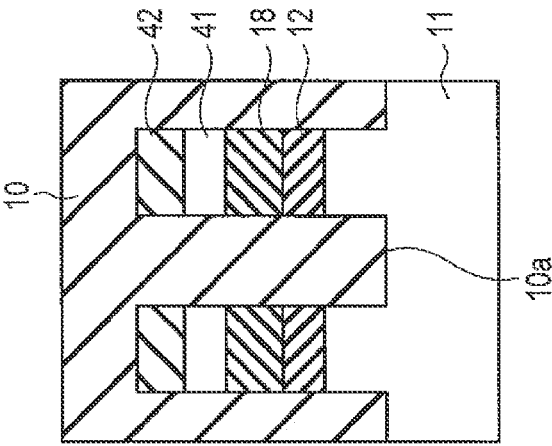

As shown in FIG. 28E, a silicon oxide film and a silicon nitride film to be a hard mask 42 are then formed on the TiN film 41. The total thickness of the silicon oxide film and the silicon nitride film is, for example, 50 to 150 nm.

A photoresist (not shown) is then applied, and a resist is patterned by exposure drawing. The photoresist (not shown) is used as an anti-etching mask to etch the silicon oxide film. After the etching, the photoresist is removed. The silicon oxide film is then used as a mask to etch the silicon nitride film. The TiN film 41, the ferroelectric film 18, the gate insulating film 12, and the semiconductor substrate 11 are then etched. As a result, an element isolation trench 10a for element isolation is formed.

An element isolation insulating film 10 which covers the side surface of the ferroelectric film 18 is then formed in the element isolation trench 10a by a coating technique. The element isolation insulating film 10 is formed by the use of a TEOS source gas with an $SiO_2$ film which is formed so that the composition of Si is higher. The element isolation insulating film 10 is deposited and at least expanded and therefore laterally compresses the ferroelectric film 18.

Here, the whole element isolation trench 10a may be filled with the cubically expandable element isolation insulating film 10 so that the side surface of the ferroelectric film 18 is covered. Alternatively, the whole element isolation trench 10a may be filled with a filling insulating film by a coating technique up to the height of the ferroelectric film 18, and the cubically expandable element isolation insulating film 10 may be only formed in the vicinity of the side surface of the ferroelectric film 18.

Figure 28F:
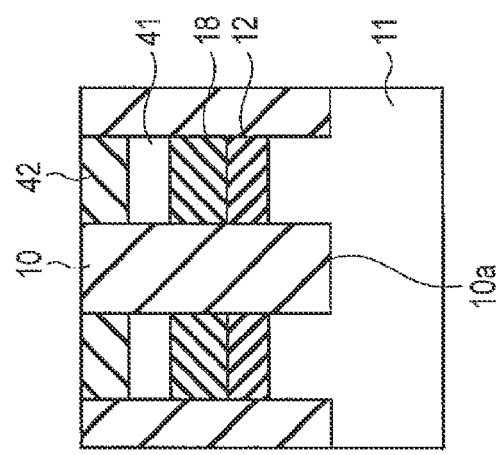

As shown in FIG. 28F, the silicon nitride film of the hard mask 42 is then used as a stopper to planarize the element isolation insulating film 10 by the chemical mechanical polishing (CMP) method. The hard mask 42 is then removed.

Figure 28G:
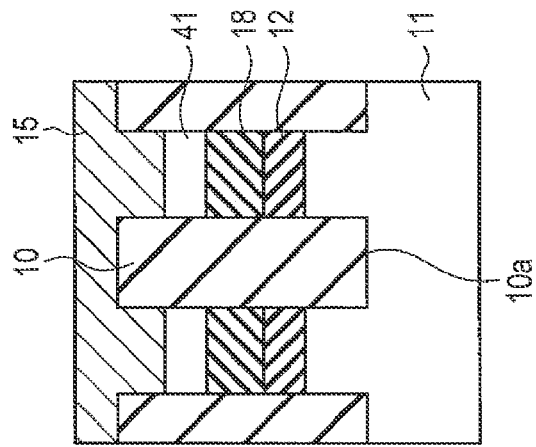

As shown in FIG. 28G, a gate electrode 15 is then formed on the TiN film 41 and the element isolation insulating film 10. The gate electrode 15 is formed by the combination of, for example, titanium nitride, tantalum nitride, tungsten nitride, molybdenum nitride, tungsten, and molybdenum, or formed by, for example, impurity-added silicon. The gate electrode 15 is then patterned by exposure drawing. A ferroelectric memory is then completed after a normal post-process.

[7-3] Advantageous Effects

When a TiN film is formed immediately on an amorphous HfSiO film in a conventional ferroelectric memory that uses a ferroelectric HfO film, the interface between the HfSiO film and the TiN film is fixed, and the cubic volume of the HfSiO film tends to shrink due to crystallization in the subsequent thermal process. However, as the interface between the HfSiO film and the TiN film is fixed, the HfSiO film cannot sufficiently shrink, and tensile stress is generated in the HfSiO film. The HfSiO film is formed into an orthorhombic form by the crystallization under the strong stress. However, the formation of a ferroelectric memory that uses this HfSiO film undergoes a large number of thermal processes. Therefore, even at a temperature lower than that in the thermal process for the crystallization, migration is gradually generated through defects in the crystalline film, and the stress is lessened. If this migration progresses, the HfSiO film undergoes phase transition from orthorhombic crystal to monoclinic and tetragonal crystal, and does not develop ferroelectricity any longer.

In contrast, according to the seventh embodiment, the cubically expandable element isolation insulating film 10 is formed on the side surface of the ferroelectric film 18. Compressive stress is applied to the side surface of the ferroelectric film 18 by the cubical expansion of the element isolation insulating film 10. To lessen the compressive stress, tensile stress is generated in the ferroelectric film 18 in the polarization direction. As a result, the polarization amount (polarization surface density) of the ferroelectric film 18 increases, polarization maintaining characteristics can be improved, and memory characteristics can be improved.

[8] Eighth Embodiment

In the eighth embodiment, a stress generating film which generates tensile stress in the polarization direction of a ferroelectric film is disposed on the top of the ferroelectric film.

[8-1] Structure

Figure 29B:
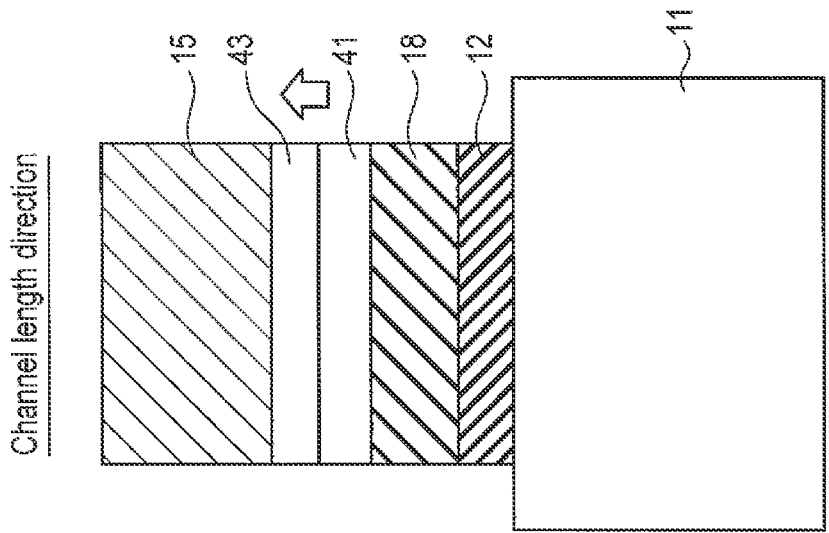
FIGS. 29A and 29B are one example of a sectional view showing the structure of a ferroelectric memory according to an eighth embodiment.
Figure 29A:
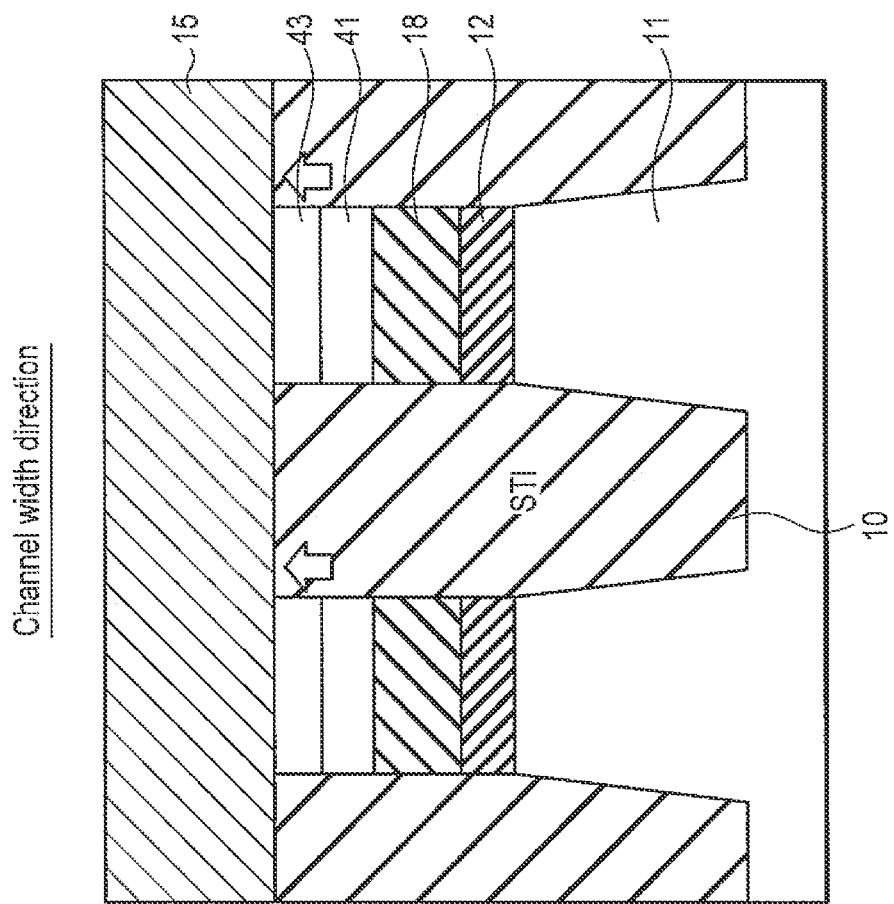

The structure of a ferroelectric memory according to the eighth embodiment is described with reference to FIGS. 29A and 29B. Here, FIG. 29A shows a sectional view in the channel width direction (word line direction). FIG. 29B shows a sectional view in the channel length direction (bit line direction).

As shown in FIGS. 29A and 29B, the eighth embodiment is different from the seventh embodiment in that a stress generating film 43 is formed on the top of a TiN film 41 on a ferroelectric film 18.

The stress generating film 43 is made of a cubically shrinkable material, and is a film which cubically shrinks to generate tensile stress therein. The stress generating film 43 applies the tensile stress in the longitudinal direction (polarization direction) of the ferroelectric film 18, and the polarizability of the ferroelectric film 18 increases.

The stress generating film 43 may be formed by, for example, B-doped amorphous Si or P-doped Si, and crystallized by a post thermal process to generate longitudinal stress. The stress generating film 43 may be formed by, for example, a low-density material (e.g. bias SPT), and contracted by a high-temperature thermal treatment to generate longitudinal stress.

[8-2] Manufacturing Method

A manufacturing method of the ferroelectric memory according to the eight embodiment is described below. Similarities between this method and the method according to the seventh embodiment are not described.

First, as in the seventh embodiment, an interfacial insulating film 12 is formed on a semiconductor substrate 11, and an amorphous HfSiOx film to be a ferroelectric film 18 is formed on the interfacial insulating film 12 by the atomic layer deposition (ALD) method. A TiN film 41 is formed on the HfSiOx film. A thermal treatment at 1000° C. is then conducted while the surface of the amorphous HfSiOx film is being fixed. Thus, HfSiOx is formed into an orthorhombic form.

An amorphous film to be a stress generating film 43 is then formed on the TiN film 41. This amorphous film needs to be a film which becomes conductive after crystallization in the subsequent thermal process. For example, B-doped amorphous Si or P-doped amorphous Si is used as the amorphous film.

As in the seventh embodiment, a hard mask is then formed under conditions at a temperature lower than in the formation of the amorphous film. An element isolation trench is then formed by patterning. This element isolation trench is filled with an insulating film formed by the coating method. An interlayer insulating film (not shown) is then formed. Here, a P—$SiH_4$ film, for example, may be formed (not shown) to form, for example, an air gap between the elements. However, this formation is preferably conducted after a thermal process that does not crystallize B-doped amorphous Si or P-doped amorphous Si in the previously formed amorphous film.

Under the condition in which the interface is fixed in the whole element structure, a thermal treatment is conducted at a temperature that crystallizes B-doped amorphous Si or P-doped amorphous Si in the amorphous film, for example, at a temperature ranging from about 600° C. to 1000° C. That is, a thermal process that does not crystallize the amorphous film is used for the formation before the interface is fixed in the whole element structure, and after this process, a crystallization thermal treatment is conducted. As a result, tensile stress is also generated in the stress generating film 43 when B-doped amorphous Si or P-doped amorphous Si is crystallized, as in the case of the HfSiOx film. Therefore, longitudinal tensile stress is also applied to the ferroelectric film 18.

While B-doped amorphous Si or P-doped amorphous Si in the amorphous film are shown as the stress generating film 43 by way of example, the stress generating film 43 is not limited thereto. For example, a low-density metal film may be formed by such a technique as bias sputtering, and the low-density metal film may be highly densified and contracted by a final high-temperature process. The high-temperature thermal treatment is preferably conducted after ILD formation around the element. In this way, stress is generated and internal stress is maintained while the interface is being fixed.

[8-3] Advantageous Effects

According to the eighth embodiment, the cubically shrinkable stress generating film 43 is provided on the top of the ferroelectric film 18. Tensile stress is generated on the top of the ferroelectric film 18 in the polarization direction by the cubical shrinkage of the stress generating film 43. As a result, the polarization amount (polarization surface density) of the ferroelectric film 18 increases, polarization maintaining characteristics can be improved, and memory characteristics can be improved, as in the seventh embodiment.

[9] Ninth Embodiment

In the ninth embodiment, a stress generating film which applies tensile stress in the polarization direction of a ferroelectric film is disposed on a source/drain region.

[9-1] Structure

The structure of a ferroelectric memory according to the ninth embodiment is described with reference to FIG. 30. Here, FIG. 30 shows a sectional view in the channel length direction (bit line direction).

Figure 30:
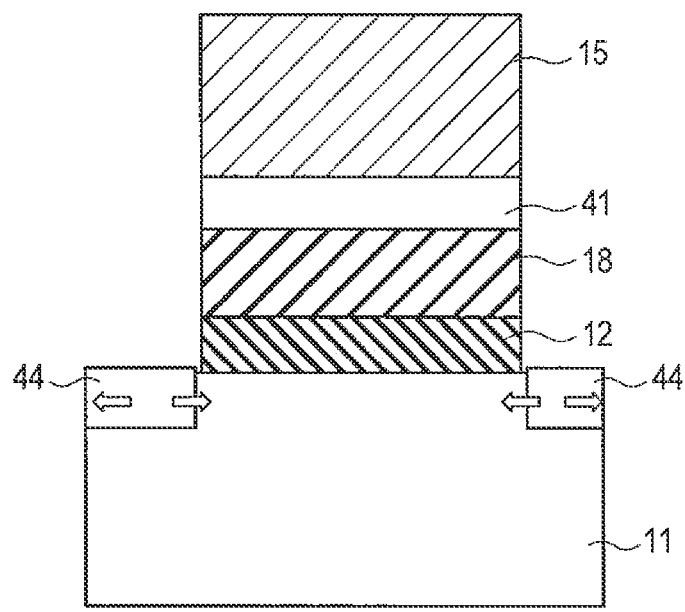
FIG. 30 is one example of a sectional view showing the structure of a ferroelectric memory according to a ninth embodiment.

As shown in FIG. 30, the ninth embodiment is different from the seventh and eighth embodiments in that a stress generating film 44 made of, for example, an SiGe film is formed on the source/drain region. The stress generating film 44 applies stress to the end of an interfacial insulating film 12 made of, for example, $SiO_2$ in the compression direction.

In the ninth embodiment, after the thermal treatment for the crystallization of the HfSiOx film, the stress generating film 44 made of SiGe is formed in the source/drain region. Lattice strain is generated because of the atomic size of Ge that is larger than the atomic size of Si. As a result of this lattice strain, and stress is applied in a direction (channel length direction) that compresses Si in the space filled with SiGe. Therefore, compressive stress is applied to the edge of the gate structure (the end of the interfacial insulating film 12) after the formation of the ferroelectric film 18 into an orthorhombic form, and this compressive stress is applied to the ferroelectric film 18. As a result, tensile stress is applied to the ferroelectric film 18 in the polarization direction, and polarization characteristics are improved.

[9-2] Advantageous Effects

According to the ninth embodiment, the stress generating film 43 which applies stress resulting from lattice strain is provided in the source/drain region under the end of the ferroelectric film 18 (interfacial insulating film 12). The stress generating film 43 applies compressive stress to the end of the interfacial insulating film 12, and tensile stress is thereby generated in the polarization direction of the ferroelectric film 18. As a result, the polarization amount (polarization surface density) of the ferroelectric film 18 increases, polarization maintaining characteristics can be improved, and memory characteristics can be improved, as in the seventh and eighth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A ferroelectric memory comprising:
an insulating film formed on a semiconductor layer, the insulating film including:
a first insulating sub-film in a memory cell region; and
a second insulating sub-film in one of (1) a select gate region and (2) a peripheral circuit region, the second insulating sub-film having a composition different from a composition of the first insulating sub-film;
first and second gate electrodes formed apart from each other and on the first insulating sub-film; and
a third gate electrode formed apart from the first electrode and on the second insulating sub-film,
wherein:
the insulating film includes:
silicon (Si),
a metal comprising at least one of hafnium (Hf) and zirconium (Zr), and
oxygen,
the insulating film is continuously formed under the first to third gate electrodes in a channel length direction,
the first insulating sub-film has a configuration such that the number of silicon (Si) atoms/(the number of Hf or Zr atoms+the number of Si atoms) is 0.02 or more and 0.05 or less,
the second insulating sub-film has a configuration that satisfies one of the following conditions:
the number of Si atoms/(the number of Hf or Zr atoms+the number of Si atoms) is less than 0.02 or more than 0.05,
the number of Si atoms/(the number of Hf or Zr atoms+the number of Si atoms) is 0.06 or more and 0.3 or less, the number of Si atoms/(the number of Hf or Zr atoms+the number of Si atoms) is 0.02 or more and 0.05 or less, and 0.1 atomic percent or more of at least one of nitrogen and carbon is added, and
the number of Si atoms/(the number of Hf or Zr atoms+the number of Si atoms) is 0.02 or more and 0.05 or less, and the second insulating sub-film has an oxygen content lower than that of the first insulating sub-film and satisfies the relation O/(Hf or Zr+Si)<2, and
the first insulating sub-film has a ferroelectric crystal structure and the second insulating sub-film has a nonferroelectric crystal structure.

2. The ferroelectric memory according to claim 1, wherein the first insulating sub-film is orthorhombic and ferroelectric.

3. The ferroelectric memory according to claim 1, wherein a boundary between the first insulating sub-film and the second insulating sub-film is located between a side surface of the first gate electrode and a side surface the third gate electrode.

* * * * *